United States Patent
Kumar et al.

(10) Patent No.: US 9,735,089 B2
(45) Date of Patent: Aug. 15, 2017

(54) THERMAL MANAGEMENT FOR FLEXIBLE INTEGRATED CIRCUIT PACKAGES

(71) Applicant: Intel Corporation, Santa Clara, CA (US)

(72) Inventors: Siddarth Kumar, Chandler, AZ (US); Hemanth K. Dhavaleswarapu, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/864,433

(22) Filed: Sep. 24, 2015

(65) Prior Publication Data

US 2017/0092564 A1    Mar. 30, 2017

(51) Int. Cl.
  *H01L 23/34*   (2006.01)
  *H01L 23/473*  (2006.01)
  *H01L 21/48*   (2006.01)
  *H01L 23/538*  (2006.01)
  *H01L 25/065*  (2006.01)

(52) U.S. Cl.
  CPC ........ *H01L 23/473* (2013.01); *H01L 21/4882* (2013.01); *H01L 23/5384* (2013.01); *H01L 25/0655* (2013.01); *H01L 25/0657* (2013.01); *H01L 2225/06548* (2013.01); *H01L 2225/06589* (2013.01)

(58) Field of Classification Search
  None
  See application file for complete search history.

(56) References Cited

U.S. PATENT DOCUMENTS

| | | | |
|---|---|---|---|
| 2003/0056940 A1* | 3/2003 | Chu | F28D 5/00 165/104.26 |
| 2005/0072716 A1* | 4/2005 | Quiles | H01L 21/67109 206/710 |
| 2005/0167820 A1 | 8/2005 | Wang | |
| 2005/0237739 A1* | 10/2005 | Lee | A61N 5/0613 362/241 |
| 2006/0103011 A1 | 5/2006 | Andry et al. | |

(Continued)

OTHER PUBLICATIONS

Wu et al., "Construction of microfluidic chips using polydimethylsiloxane for adhesive bonding", 2005, The Royal Society of Chemistry, Lap Chip, 2005, 5, pp. 1393-1398.

(Continued)

*Primary Examiner* — Sitaramarao S Yechuri
(74) *Attorney, Agent, or Firm* — Patent Capital Group

(57) ABSTRACT

Disclosed herein are systems and methods for thermal management of a flexible integrated circuit (IC) package. In some embodiments, a flexible IC package may include a flexible substrate material; a component disposed in the flexible substrate material; a channel disposed in the flexible substrate material forming a closed circuit and having a portion proximate to the component; electrodes disposed in the flexible substrate material and positioned at locations proximate to the channel, wherein the electrodes are coupled to an electrode controller to selectively cause one or more of the electrodes to generate an electric field; and an electrolytic fluid disposed in the channel. In some embodiments, a flexible IC package may be coupled to a wearable support structure. Other embodiments may be disclosed and/or claimed.

16 Claims, 11 Drawing Sheets

(56) References Cited

U.S. PATENT DOCUMENTS

| | | | |
|---|---|---|---|
| 2006/0272942 A1* | 12/2006 | Sirringhaus | G01N 27/414 204/406 |
| 2007/0190685 A1* | 8/2007 | Ebbutt | H01L 25/16 438/106 |
| 2007/0252268 A1* | 11/2007 | Chew | H01L 23/473 257/714 |
| 2008/0036076 A1* | 2/2008 | Ouyang | H01L 23/34 257/714 |
| 2008/0205017 A1 | 8/2008 | Nellissen et al. | |
| 2008/0266787 A1* | 10/2008 | Gosset | H01L 21/7682 361/689 |
| 2009/0032937 A1* | 2/2009 | Mann | H01L 23/4735 257/712 |
| 2009/0237897 A1* | 9/2009 | Ratcliffe | H01L 23/5389 361/760 |
| 2009/0284921 A1 | 11/2009 | Colgan et al. | |
| 2010/0127390 A1* | 5/2010 | Barth | H01L 23/473 257/714 |
| 2011/0150667 A1* | 6/2011 | Bernstein | F04B 9/10 417/50 |
| 2014/0319672 A1* | 10/2014 | Tsubokawa | H01L 23/473 257/712 |
| 2016/0254212 A1* | 9/2016 | Kusaka | H01L 23/34 |

OTHER PUBLICATIONS

Qin et al., "Soft lithography for micro- and nanoscale patterning", Feb. 18, 2010, Nature Protocols, vol. 5, No. 3, pp. 491-502.

Chou, et al., "Fabrication of Stretchable and Flexible Electrodes Based on PDMS Substrate", Jan. 29-Feb. 2, 2012, MEMS 2012, pp. 247-250.

Pollack, et al., "Electrowetting-based actuation of droplets for integrated microfluidics", Nov. 15, 2001, The Royal Society of Chemistry 2002, Lap Chip, 2002, 2, 96-101.

Cho, et al., "Creating, Transporting, Cutting, and Merging Liquid Droplets by Electrowetting-Based Actuation for Digital Microfluidic Circuits", Feb. 2003, Journal of Microelectromechanical Systems, vol. 12, No. 1., pp. 70-80.

Fernandes, et al., "Flexible PDMS—based dry electrodes for electro-optic acquisition of ECG signals in wearable devices", Sep. 4, 2010, $32^{nd}$ Annual International Conference of the IEEE EMBS, pp. 3503-3506.

Mamun, et al., "Patterning of platinum microelectrodes in polymeric microfluidic chips", Jul.-Sep. 2006, J. Microlith., Microfab., Microsyst., vol. 5(3), pp. 039701-1-039701-6.

Pollack, et al., "Electrowetting-based actuation of liquid droplets for microfluidic applications", 2000, Applied Physics Letters, vol. 77, No. 11, pp. 1725-1726.

U.S. Appl. No. 14/227,779, "Electric Circuit on Flexible Substrate", filed Mar. 27, 2014, 31 pages.

Temiz, et al., "Lab-on-a-chip devices: How to close and plug the lab?", May 16, 2014, Microelectronic Engineering 132 (2015) pp. 156-175.

International Search Report and Written Opinion in International Application No. PCT/US2016/048163 mailed Nov. 18, 2016.

* cited by examiner

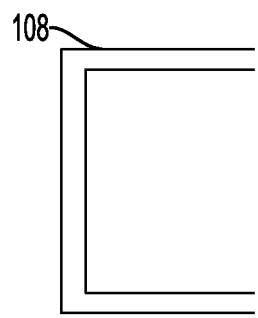 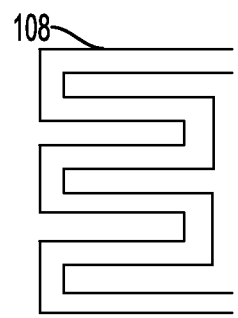
FIG. 25    FIG. 26
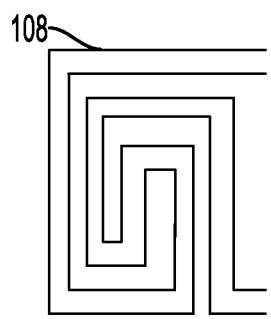 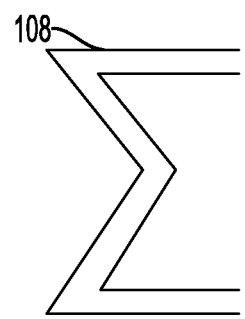
FIG. 27    FIG. 28

US 9,735,089 B2

THERMAL MANAGEMENT FOR FLEXIBLE INTEGRATED CIRCUIT PACKAGES

TECHNICAL FIELD

This disclosure relates generally to the field of integrated circuits, and more specifically, a thermal management for flexible integrated circuit packages.

BACKGROUND

Integrated circuit (IC) devices generate heat during operation. If this heat causes the temperature of the device to rise to a critical level, performance may be compromised or the device may fail. Conventional techniques for managing the heat generated by conventional IC devices include the use of heat sinks and fans.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 25-28 illustrate various example structures that may be used for a portion of a channel proximate to a component in the flexible IC package of FIG. 1, in accordance with various embodiments.

DETAILED DESCRIPTION

Figure 1:
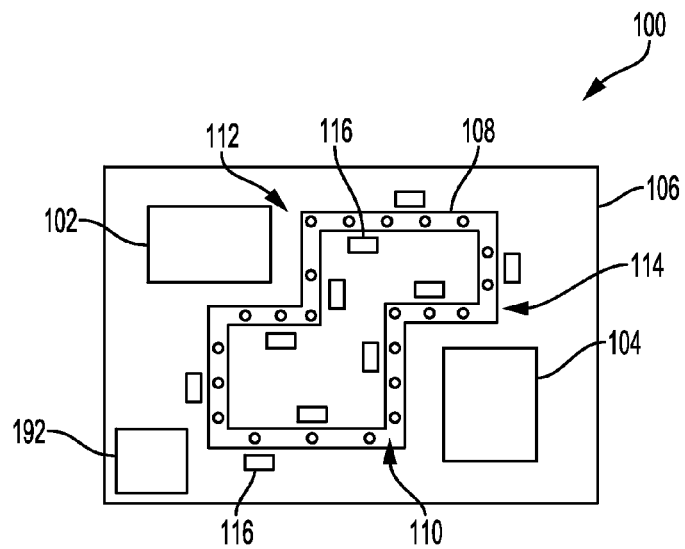
FIG. 1 is a representation of a flexible integrated circuit (IC) package, in accordance with various embodiments.

Disclosed herein are systems and methods for thermal management of a flexible integrated circuit (IC) package. In some embodiments, a flexible IC package may include a flexible substrate material; a component disposed in the flexible substrate material; a channel disposed in the flexible substrate material forming a closed circuit and having a portion proximate to the component; electrodes disposed in the flexible substrate material and positioned at locations proximate to the channel, wherein the electrodes are coupled to an electrode controller to selectively cause one or more of the electrodes to generate an electric field; and an electrolytic fluid disposed in the channel. The electric fields generated by the electrodes may cause the electrolytic fluid to move within the channel (e.g., to circulate within the channel) via electrowetting. When the component disposed proximate to the channel generates heat, some of that heat may be absorbed by the electrolytic fluid and then moved away from the component by movement of the electrolytic fluid, thus cooling the component or mitigating any buildup of heat. In some embodiments, the flexible IC packages disclosed herein may be coupled to a wearable support structure to form a flexible, wearable, thermally managed IC device.

Development of flexible electronic devices has been limited by conventional thermal management techniques. For example, conventional IC packages may include a metallic heat spreader thermally coupled to a heat-generating component (e.g., a die) with a thermal interface material. However, heat spreaders may be of limited utility when the heat-generating component is embedded inside one or more layers of flexible substrate material and/or mold material (and thus not readily coupled to the heat spreader). External cooling devices, such as fans and heat sinks, are similarly infeasible for flexible and/or wearable applications, at least due to their large size, moving parts, power requirements, and inability to cool heat-generating devices embedded in insulating material. Additionally, conventionally rigid structures such as heat spreaders and heat sinks may be inappropriate for use in flexible electronic devices, at least because such rigid structures may compromise package bendability and stretchability.

Some conventional thermal management techniques attempt to limit or reduce thermal design power (TDP) of an electronic device. The TDP of a device represents the maximum amount of heat that a cooling system may be required to dissipate from the device during typical operation; the lower the TDP, the less thermal management need be performed. One conventional TDP-limiting technique involves "throttling" a device within an IC package (e.g., by reducing the device's operating frequency and thereby slowing the device) so as to limit the amount of heat that the device generates. This approach, however, has the substantial drawback of constraining the device to perform below its true capability, and possibly causing the device to fail to meet performance benchmarks or requirements. Similarly, the heat generated by an IC package may be limited by including fewer and/or less powerful components in the IC package, but this approach also inherently limits the performance achievable by the IC package. Performance limitations due to thermal phenomena (e.g., limitations on battery life, user comfort during normal use, throttled processing) may result in a degraded user experience.

In addition to the inapplicability of conventional thermal management techniques to flexible and/or wearable IC devices, many such devices may have more stringent thermal requirements for user comfort than conventional IC devices. For example, for comfortable use, an IC device that will be in regular contact with human skin should not exceed a maximum temperature that is lower than the maximum temperature tolerated for laptop computing devices, tablets, or other conventional handheld computing devices. This maximum temperature may be between approximately 37° C. and 45° C. and may be a function of a particular location of the IC device on a wearer's body (e.g., with the maximum temperature allowable at the ear and forehead less than the maximum temperature allowable at the fingers). Consequently, many wearables must be maintained at lower operating temperatures than "smartphones" and other mobile computing devices.

The challenge of achieving sufficiently low operating temperatures for flexible devices is compounded by low thermal conductivities of many materials that may otherwise be suitable as flexible substrate materials and/or mold materials. For example, polyethylene terephthalate (PET) and polydimethylsiloxane (PDMS) may have thermal conductivities of approximately 0.15 watts per meter-Kelvin, which is approximately ⅑ the thermal conductivity of mold materials used in existing system-on-chip (SoC) products (which often have significant thermal risk themselves). Thus, flexible IC devices may be formed from materials that are less able to conduct heat away from components embedded therein than conventional IC devices.

Various ones of the embodiments disclosed herein may enable high-performance computing devices in flexible packages that achieve improved thermal performance relative to conventional devices and techniques. In particular, various ones of the embodiments disclosed herein may extend the TDP of flexible IC devices while maintaining or improving performance and without compromising device stretchability and bendability. The embodiments disclosed herein may be usefully applied in multilayer IC package designs, in which multiple components (e.g., dies or sensors) are embedded between different layers of flexible material, without compromising bendability or stretchability. Flexible IC packages may be readily integrated into wearable supports to form wearable devices, such as jewelry, smart fabrics, or stickers/tattoos for wearing on the skin. Additionally, various ones of the embodiments disclosed herein may be readily manufactured using soft lithography techniques.

Additionally, incorporating thermal management techniques disclosed herein in rigid IC packages may improve thermal performance and reduce the yield loss during the manufacturing process due to unsatisfactory thermal performance. In particular, the use of various ones of the thermal management techniques disclosed herein may reduce the maximum or average operating temperature of an IC device relative to conventional techniques, and thus may reduce the number of IC devices whose maximum or average operating temperatures exceed a reliability temperature limit.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

FIG. 1 is a representation of a flexible integrated circuit (IC) package 100, in accordance with various embodiments. The flexible IC package 100 may include a first component 102 disposed in a flexible substrate material (FSM) 106. A channel 108 may be disposed in the FSM 106, and an electrolytic fluid 110 may be disposed in the channel 108. A first portion 112 of the channel 108 may be proximate to the first component 102. As used herein, a portion of a channel may be "proximate" to a component when the channel is sufficiently close to the component so that heat generated by the component may be absorbed by thermally conductive fluid within the channel so as to thermally manage the component as the fluid moves through the channel, away from the component.

In some embodiments, as illustrated in FIG. 1, a second component 104 may also be disposed in the FSM 106, and a second portion 114 of the channel 108 may be proximate to the second component 104. Although two components are illustrated in FIG. 1, any number of components may be disposed in the FSM 106. For example, in some embodiments, only a single component (e.g., the first component 102) may be disposed in the FSM 106 and may be proximate to the channel 108. In some embodiments, examples of which are discussed in detail below, three or more components may be disposed in the FSM 106 and may be proximate to the channel 108.

The component(s) disposed in the FSM 106 may perform any suitable desired computational function or functions. For example, in some embodiments, the first component 102 and/or the second component 104 may include a processing device, a memory device, a sensor, and/or a communication device (e.g., a modem). In some embodiments, the first component 102 and/or the second component 104 may include a die. In some embodiments, the component(s) disposed in the FSM 106 may be formed as fairly thin, semiconductor-based circuits (e.g., silicon-based dies), and may be embedded between layers of the FSM 106. A number of examples of arrangements of components in the FSM 106 are discussed in detail below. Any of the "components" referred to herein may be "component sections"; that is, circuitry configured to implement at least a portion of the functionality of a portion of a singular SoC. An example of a component section may be a die segment. The combination of multiple component sections (or "components," as used herein) may implement the functionality of the SoC. A component section may include silicon or other semiconductor, metal, or other circuit material (as may any "component" referred to herein).

The representation and arrangement of elements in FIG. 1 is abstract, and is to be interpreted in accordance with the description below and the remainder of the teachings herein. In particular, FIG. 1 is not intended to require an arrangement of the IC package 100 in which all of the elements of FIG. 1 are co-planar (e.g., arranged in a single layer in a multi-layer IC package 100). Indeed, in embodiments in which the first component 102 and/or the second component 104 have a thin form factor, it may be difficult to achieve adequate heat transfer when the channel 108 is constrained to be solely co-planar with the first component 102 and/or the second component 104 (e.g., when only a narrow side of the first component 102 and/or the second component 104 faces the channel 108), and instead, portions of the channel 108 may be arranged to be non-co-planar with the first component 102 and/or the second component 104 (e.g., in a different layer than the first component 102 and/or the second component 104, so that the larger face of the first component 102 and/or the second component 104 faces the channel 108) so there is a greater area over which heat may be transferred.

The channel 108 may form a closed circuit such that the electrolytic fluid 110 is constrained to remain within the channel 108. In some embodiments, the channel 108 may be formed such that the electrolytic fluid 110 is constrained to remain within the channel 108, but the channel 108 may not form a closed circuit (e.g., the channel 108 may be shaped as a tube with one or more bends). In some embodiments, the interior surface of the channel 108 may be coated in a dielectric (e.g., Teflon, barium strontium titanate (BST), or any other suitable dielectric), and electrowetting on dielectric (EWOD) techniques may be used to move the electrolytic fluid 110 in the channel 108. In some embodiments, the interior surface of the channel 108 may be coated in a metal, and metal-based electrowetting techniques may be used.

As used herein, "electrolytic fluid" may include any fluid that has an electrolytic component that can undergo electrowetting (as discussed further below). The electrolytic fluid 110 may include any suitable fluids and may not have a uniform composition. For example, in some embodiments, the electrolytic fluid 110 may include electrolyte droplets in oil. One example of the electrolytic fluid 110 may be potassium chloride (KCl) droplets in silicone oil, but any suitable fluid may be used.

In some embodiments, the electrolytic fluid 110 may include an organic solvent. When the FSM 106 includes a polymer material that may absorb organic solvents, any of a number of known techniques may be used to improve the hermeticity of the flexible IC package 100. Examples of suitable techniques for improving the hermeticity of the flexible IC package 100 include coating the polymer material with a hybrid organic/inorganic polymer to prevent contact between the polymer material and the organic solvent (e.g., as described in Kim et al., Solvent-resistant PDMS microfluidic devices with hybrid inorganic/organic polymer coatings, *Advanced Functional Materials*, v. 19, pp. 3796-3803 (2009)), thermal aging during carrying, and changing the ratio of pre-polymer and curing agent of a polymer (both of which are described in, e.g., Huang et al., The improved resistance of PDMS to pressure-induced deformation and chemical solvent swelling for microfluidic devices, *Microelectronic Engineering*, v. 124, pp. 66-75 (2014)). In some embodiments, the electrolytic fluid 110 may include an inorganic solvent (e.g., water).

The flexible IC package 100 may be capable of bending and/or stretching without damaging the components therein. This ability may make some embodiments of the flexible IC package 100 particularly suitable for wearable computing applications, in which the flexible IC package 100 is disposed on or close to a user's body and should be capable of deforming with the user's movement. The FSM 106 may include any suitable flexible substrate material or materials. For example, in some embodiments, the FSM 106 may include PET. In some embodiments, the FSM 106 may include PDMS. In some embodiments, the FSM 106 may include polyimide or another thermoplastic elastomer.

Two or more electrodes 116 may be disposed in the FSM 106 and may be positioned at locations proximate to the channel 108. As used herein, an electrode may be positioned at a location "proximate" to a channel when an electric field generated by the electrode is sufficiently strong to move electrolytic fluid in the channel by electrowetting. To achieve a sufficiently strong electric field, it may be advantageous in some embodiments to position the electrodes in a layer of the FSM 106 adjacent to the channel 108 (e.g., "under" the channel 108), but any suitable arrangement may be used in accordance with the teachings herein. Electrowetting generally refers to the application of an electric field to a fluid to change the ability of that fluid to maintain contact with a solid surface and, more specifically herein, refers to the application of an electric field on one side of an electrolyte droplet and a channel to asymmetrically change the interfacial surface tension of that droplet to asymmetrically deform a liquid meniscus and thereby drive bulk fluid motion in the channel. A number of techniques exist for the transportation of fluid droplets through micro-channels via electrowetting, such as those described by Cho et al., Creating, transporting, cutting, and merging liquid droplets by electrowetting-based actuation for digital microfluidic circuits, *Journal of Microelectromechanical Systems*, v. 12.1, pp. 70-80 (2003). Although a particular number of electrodes 116 are illustrated in FIG. 1, any suitable number of electrodes may be included in the flexible IC package 100. The electrodes 116 may be formed from any suitable conductive material, such as copper.

The electrodes 116 may be coupled to an electrode controller 192, which may be configured to selectively cause one or more of the electrodes 116 to generate an electric field. More specifically, electrodes 116 may be arranged along the channel 108 such that electric fields may be generated between two or more of the electrodes 116. In some embodiments, the electrode controller 192 may be included in the first component 102 or the second component 104 (which may be, e.g., dies), while in other embodiments, the electrode controller 192 may be separate from any components cooled using the thermal management techniques disclosed herein.

During use, the electrode controller 192 may cause sequential sets of the electrodes 116, beneath the leading meniscus of an electrolytic droplet in the electrolytic fluid 110, to generate electric fields so as to move the droplet of the electrolytic fluid 110, via electrowetting, within the channel 108. In some embodiments, the electrode controller 192 may cause the electrodes 116 to generate electric fields so as to circulate the electrolytic fluid 110 through the channel 108. The electrode controller 192 may cause two or more of the electrodes 116 to generate an electric field by providing a voltage to the two or more electrodes 116. The level and distribution of voltage applied may depend on the particular configuration of the flexible IC package 100 and the desired rate of movement of the electrolytic fluid 110, and in some embodiments may be between approximately 15 and approximately 50 volts.

In some embodiments, one or more of the electrodes 116 may be coupled to a reference voltage by the electrode controller 192 (e.g., to ground), and the voltage on the electrodes 116 may not change during operation; instead, the voltages on other ones of the electrodes 116 may change to cause the changing electric fields that drive movement of the electrolytic fluid 110. An example of such a technique is discussed in Pollack et al., Electrowetting-based actuation of droplets for integrated microfluidics, *Lab Chip*, v. 2, pp. 96-101, (2002) and in Pollack et al., Electrowetting-based actuation of liquid droplets for microfluidic applications, *Appl. Phys. Lett.*, v. 77, n. 11, pp. 1725-1726 (2000). The use of electrodes to drive electrolytic fluid through a channel may be performed in accordance with the teachings disclosed herein and the techniques known in the art (including those referred to herein), and thus are not discussed in detail herein.

The electrolytic fluid 110 may absorb heat from the first component 102 and/or the second component 104 and may transport that heat along the channel 108 as the electrolytic fluid 110 moves in the channel 108. This heat may be dissipated in regions of the flexible IC package 100 that are cooler than the first component 102 and/or the second component 104, thereby cooling the first component 102 and/or the second component 104.

In some embodiments, circulation of the electrolytic fluid 110 within the channel 108 may occur continuously to distribute heat in regions of the flexible IC package 100 proximate to the channel 108. In some embodiments, circulation of the electrolytic fluid 110 within the channel 108 may occur at predetermined intervals (e.g., periodically after a predetermined number of minutes, periodically after the flexible IC package 100 has been in active use for a predetermined period, etc.).

In some embodiments, the electrode controller 192 may be configured to selectively cause one or more of the electrodes 116 to generate an electric field based on one or more indicators of a temperature of the first component 102 or the second component 104. For example, circulation of the electrolytic fluid 110 within the channel 108 may occur when one or more components proximate to the channel 108 exceeds a temperature threshold. The temperature threshold may be different for different ones of the one or more components, and the temperature of the component may be measured by a temperature sensor included in the component itself or a temperature sensor (e.g., a thermocouple) disposed in the flexible IC package 100 proximate to the component. For example, the first component 102 may be associated with a first temperature threshold, and the second component 102 may be associated with a second temperature threshold. When the temperature of the first component 102 exceeds the first threshold, or the temperature of the second component 102 exceeds the second threshold, the electrode controller 192 may cause one or more of the electrodes 116 to generate electric fields to circulate the electrolytic fluid 110. In some embodiments, the temperature threshold associated with a particular component may depend on the temperature of another component or region in the flexible IC package 100 (e.g., another component in the flexible IC package 100). For example, the electrode controller 192 may be configured to cause circulation of the electrolytic fluid 110 in the channel 108 when the temperature of the first component 102 exceeds the temperature of the second component 104. In such an embodiment, the temperature threshold associated with the first component 102 is the temperature of the second component 104 (which will likely change during operation).

In some embodiments, the arrangement of the channel 108 within the flexible IC package 100 may be selected so some portions of the channel 108 are proximate to components or other components that are less likely to be "hot" and other portions of the channel 108 are proximate to components or other components that are more likely to be "hot" (and in need of cooling). For example, if the first component 102 is a processing device having a core or other computing element, and the second component 104 is an image processing device (e.g., a graphics component) or a device not having a core (an "uncore" device, such as a communications device), the first component 102 is likely to run hotter than the second component 104. In such an embodiment, the channel 108 may be advantageously routed so that the first portion 112 is proximate to the first component 102 and the second portion 114 is proximate to the second component 104; heat generated by the "hot" first component 102 may be absorbed by the electrolytic fluid 110 in the first portion 112, and the electrolytic fluid 110 may transport that heat through the channel 108 toward the "cool" second component 104 (where the heat may be dissipated). This circulation may occur continuously, periodically, or in response to the first component 102/second component 104 exceeding a temperature threshold. In this manner, temperature gradients within the flexible IC package 100 may be mitigated by dynamically moving heat from higher temperature areas to lower temperature areas.

In some embodiments, the arrangement of the channel 108 within the flexible IC package 100 may be selected so different portions of the channel 108 are proximate to components that are not likely to be "hot" (and in need of cooling) at the same time. For example, if the first component 102 and the second component 104 are unlikely to be generating significant heat at the same time, the channel 108 may be advantageously routed so that the first portion 112 is proximate to the first component 102 and the second portion 114 is proximate to the second component 104; when the first component 102 is active, the electrolytic fluid 110 in the first portion 112 may absorb the heat and transport through the channel 108 toward the inactive, cooler second component 104 (where the heat may be dissipated), and vice versa.

This circulation may occur continuously, periodically, or in response to the first component 102/second component 104 exceeding a temperature threshold. In this manner, temperature gradients within the flexible IC package 100 may be mitigated by dynamically moving heat from higher temperature areas to lower temperature areas.

Various ones of the IC package 100 disclosed herein may reduce the peak temperature of regions within the flexible IC package 100 proximate to the channel 108 during operation and test by selectively and actively transporting heat from these regions to other, cooler regions via the electrowetting-based integrated thermal management system provided by the electrode controller 192, the electrodes 116, the electrolytic fluid 110, and the channel 108. "Hot" regions may be those proximate to components that generate significant heat, and "cool" regions may be those proximate to components or other components in the flexible IC package 100 that generate less or no heat. The degree of reduction of peak component temperature in various embodiments will depend on the particular arrangement of components in the flexible IC package 100, but the inclusion of the thermal management systems disclosed herein may achieve reductions in peak component temperature of 20% or more. The thermal management systems disclosed herein may also consume a minimal amount of power (on the order of fractions of a milliwatt), and thus may be particularly appropriate for low-power wearable computing applications (which may have a typical power consumption on the order of 1 watt).

Some of the embodiments of the flexible IC package 100 disclosed herein may provide an active, integrated, multilayer thermal solution for flexible, bendable packages, wherein the incorporation of the thermal solution into the flexible IC package 100 does not compromise the bendability and stretchability of the flexible IC package 100. In some embodiments, as discussed below, the thermal management systems disclosed herein can selectively cool parts of the flexible IC package 100 in different layers of the FSM 106 based on the arrangement of the channel 108 (or multiple channels, as discussed below). In some embodiments, the thermal management systems disclosed herein may minimize thermal yield loss during manufacturing test by actively reducing the temperature of the flexible IC package 100 to keep the temperature below the reliability temperature limit. Additionally, in some embodiments, the thermal management systems disclosed herein may improve performance of the flexible IC package 100 during use in the field by keeping the temperature of the flexible IC package 100 below the maximum allowable temperature without throttling the performance of the flexible IC package 100.

In some embodiments, any of the flexible IC packages 100 disclosed herein may include any of the embodiments of the flexible apparatus disclosed in co-pending U.S. patent application Ser. No. 14/227,779, titled "ELECTRIC CIRCUIT ON FLEXIBLE SUBSTRATE." For example, the IC package 100 may include a glass island on a flexible substrate, an interconnect on the flexible substrate and partially overlapping the glass island, a component (e.g., a die) situated on the glass island and electrically coupled to the interconnect, and a layer of glass over the device and at least partially over the interconnect, such that the layer of glass, the glass island, and the interconnect form a hermetic seal for the device. In another example, the IC package 100 may include multiple stacked flexible substrate layers including a first substrate layer on a second substrate layer, first and second component sections situated in the stacked flexible substrate layers, and a first interconnect circuit patterned on a surface of the second substrate layer proximate the first substrate layer, wherein the first and second component sections are electrically coupled through the interconnect circuit. In another example, the IC package 100 may include an apparatus formed by forming an interconnect on a flexible substrate, situating a component (e.g., a die) on the substrate near the interconnect, and selectively depositing a first hermetic material on the device and interconnect so as to hermetically seal the device within the combination of the interconnect and first hermetic material.

As noted above, the flexible IC package 100 may include one or more components, such as the first component 102 and the second component 104. Different IC package designs may include different numbers and arrangements of components. For example, in multilayer embedded component packages, different components (e.g., different component segments) may be located between different layers of the FSM 106. FIGS. 2-17 illustrate a number of embodiments of IC packages 100 having different arrangements of components and channels. In these embodiments, one or more components disposed in the same or different layers of a multilayer flexible and bendable IC package 100 are proximate to one or more channels containing the electrolytic fluid 110 (e.g., electrolyte droplets in oil) in which the electrolytic fluid 110 circulates via electrowetting to transport heat from hotter regions of the flexible IC package 100 to cooler regions of the flexible IC package 100. In some embodiments, electrodes 116 printed on different layers of the FSM 106 may drive the motion of the electrolytic fluid 110, thus inducing bulk flow in the channel 108 in different layers. Thus, in some embodiments, the channel 108 may act as a self-contained circular mixer in which fluid is driven in bulk by electrowetting induced by the electrodes 116.

The embodiments illustrated in FIGS. 2-17 are simply illustrative, and any suitable arrangements in accordance with the teachings herein are within the scope of this disclosure. In particular, the electrodes illustrated in FIGS. 2-17 may not represent particular sizes, shapes, numbers, or arrangements of the electrodes, but instead indicate potential locations for at least some of the electrodes. Arrangements in accordance with the embodiments disclosed herein may include more or fewer electrodes than illustrated, and the electrodes may be positioned as illustrated or in any other suitable location so that electrowetting-based movement of the electrolytic fluid may occur, in accordance with the teachings herein and the techniques known in the art. The number, size, shape, and arrangement of the electrodes proximate to a channel may take any suitable form, such as any of those described in detail herein or discussed in any of the references cited herein. For example, in embodiments where the electrolytic fluid includes electrolyte droplets in oil, each of the electrodes may be dimensioned such that the area of a face of an electrode facing the channel is similar to the "footprint" of an electrolyte droplet.

Figure 16:
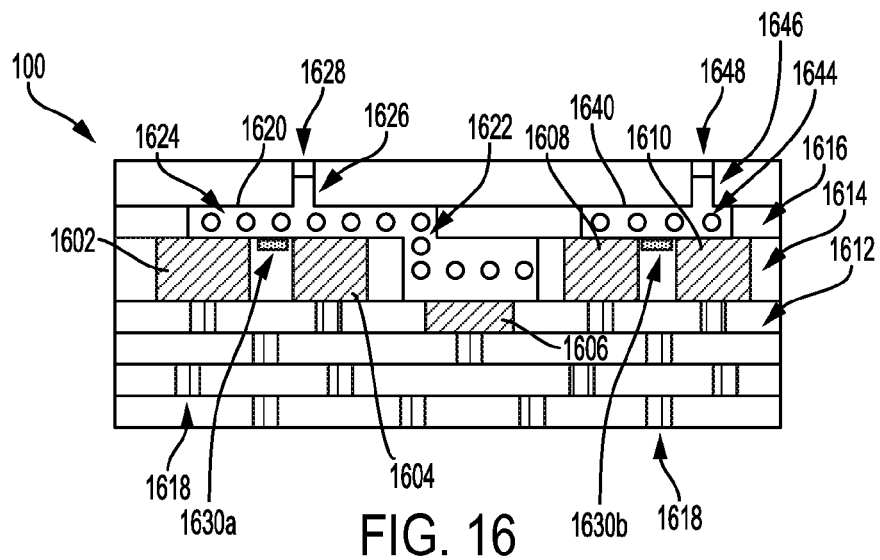
FIGS. 16 and 17 are portions of side views of additional examples of flexible IC packages, in accordance with various embodiments.
Figure 17:
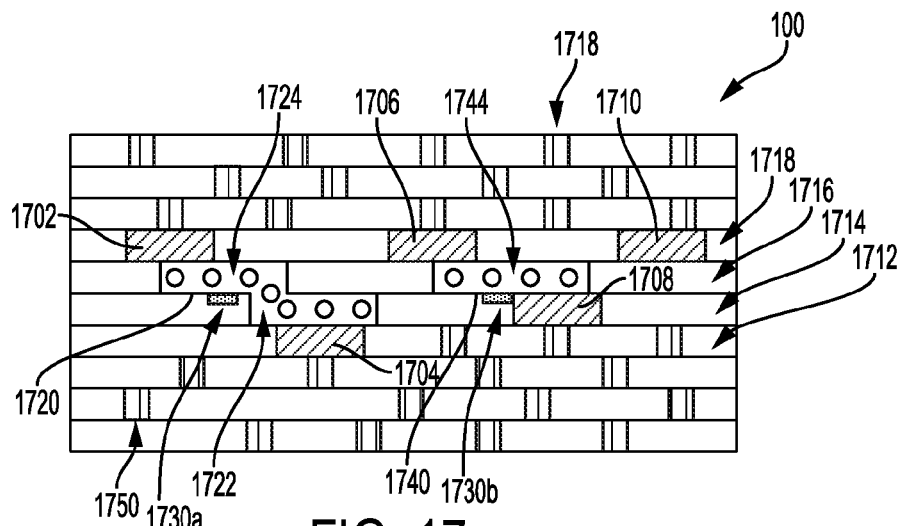

Additionally, a number of other structures not illustrated in FIGS. 2-17 may be included in the flexible IC packages 100 discussed with reference to FIGS. 2-17. These structures may include conductive vias between different layers of the FSM 106, "horizontal" conductive traces to route electrical signals within the flexible IC package 100, and other components embedded in the flexible IC package 100 (e.g., other electrical components, optical components, etc.). For example, FIGS. 16 and 17 illustrate interlayer conductive material that may be used to route electrical signals between layers of the FSM 106 in some example flexible IC packages 100, and any of the embodiments of the flexible IC package 100 discussed herein may include such conductive material and any other suitable structures.

Figure 2:
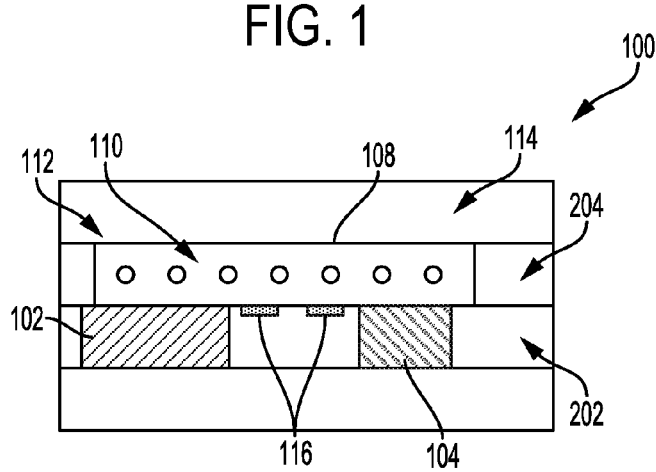
FIG. 2 is a portion of a side view of a first example of a flexible IC package.
Figure 3:
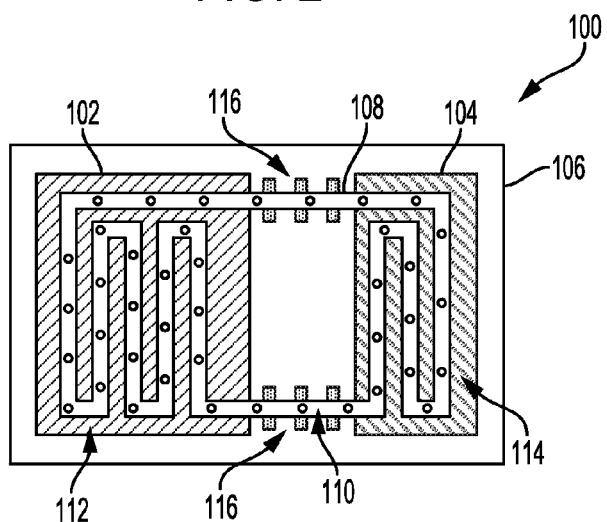
FIG. 3 is a portion of a top view of the first flexible IC package example of FIG. 2, in accordance with various embodiments.

FIGS. 2 and 3 illustrate a first example embodiment of the flexible IC package 100. In particular, FIG. 2 is a portion of a side view of an embodiment of the flexible IC package 100, and FIG. 3 is a portion of a top view of the flexible IC package 100 of FIG. 2. In the embodiment of FIGS. 2 and 3, the flexible IC package 100 includes a first layer 202 of the FSM 106 and a second layer 204 of the FSM 106. Other layers of the FSM 106 may be included in the flexible IC package 100 of FIGS. 2 and 3 (and the flexible IC package 100 as illustrated in FIGS. 4-17), and some examples are illustrated therein. The first component 102 and the second component 104 may be disposed in the first layer 202. The channel 108 may be disposed in the second layer 204, with the electrolytic fluid 110 disposed therein. The first portion 112 of the channel 108 may be proximate to the first component 102, and the second portion 114 of the channel 108 may be proximate to the second component 104.

The first portion 112 of the channel 108 and the second portion 114 of the channel 108 may each have a serpentine structure, as illustrated in FIG. 3. The serpentine structure may increase the volume of electrolytic fluid 110 that can absorb heat from the corresponding component, and thus improve the volume of thermal transfer. Although many of the embodiments discussed with reference to FIGS. 2-17 may illustrate serpentine structures for various portions of the channel 108, any other suitable structure may be used, a number of examples of which are discussed below with reference to FIGS. 25-28. The electrodes 116 may include electrodes disposed between the first layer 202 and the second layer 204 (e.g., printed on the first layer 202 prior to formation of the second layer 204). The electrodes 116 of FIGS. 2 and 3 may be positioned at locations proximate to the channel 108 so as to effect movement of the electrolytic fluid 110 via dynamic electric fields under the control of the electrode controller 192 (not shown).

Figure 4:
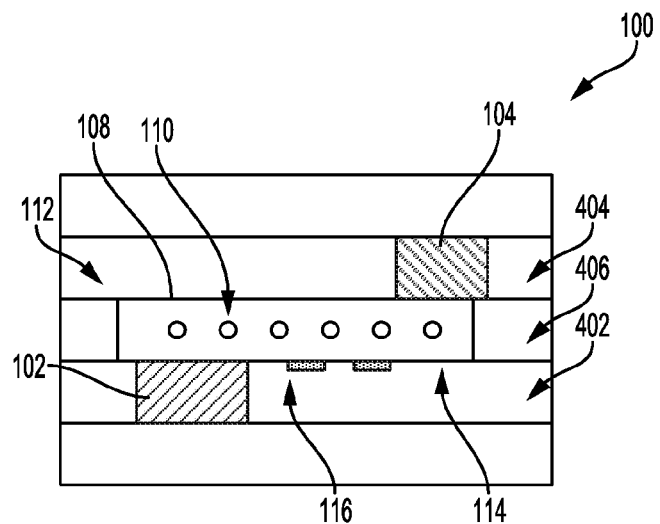
FIG. 4 is a portion of a side view of a second example of a flexible IC package.
Figure 5:
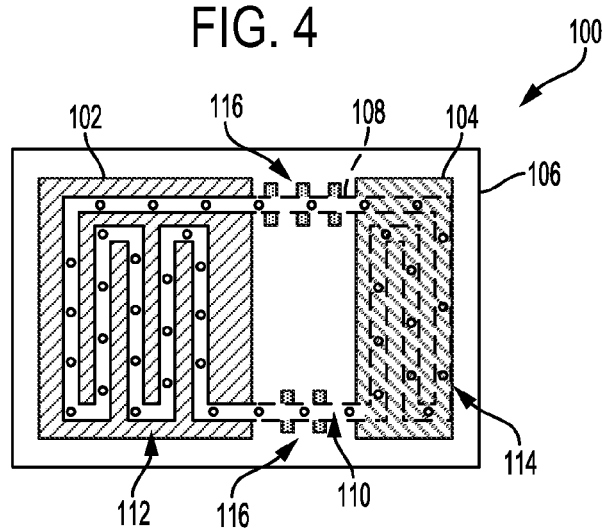
FIG. 5 is a portion of a top view of the second flexible IC package example of FIG. 4, in accordance with various embodiments.

FIGS. 4 and 5 illustrate a second example embodiment of the flexible IC package 100. In particular, FIG. 4 is a portion of a side view of an embodiment of the flexible IC package 100, and FIG. 5 is a portion of a top view of the flexible IC package 100 of FIG. 4. In the embodiment of FIGS. 4 and 5, the flexible IC package 100 includes a first layer 402 of the FSM 106, a second layer 404 of the FSM 106, and a third layer 406 of the FSM 106, with the third layer 406 disposed between the first layer 402 and the second layer 404. The first component 102 may be disposed in the first layer 402, the second component 104 may be disposed in the second layer 404, and the channel 108 may be disposed in the third layer 406 (with the electrolytic fluid 110 disposed therein). The first portion 112 of the channel 108 may be proximate to the first component 102, and the second portion 114 of the channel 108 may be proximate to the second component 104. The electrodes 116 may include electrodes disposed between the first layer 402 and the third layer 406 (e.g., printed on the first layer 402 prior to formation of the third layer 406). The electrodes 116 of FIGS. 4 and 5 may be positioned at locations proximate to the channel 108 so as to effect movement of the electrolytic fluid 110 via dynamic electric fields under the control of the electrode controller 192 (not shown).

Although FIG. 4 shows the first layer 402 adjacent to the third layer 406, and the third layer 406 adjacent to the second layer 404, this need not be the case. In some embodiments, the first layer 402 may be spaced away from the third layer 406 by one or more intervening layers of the FSM 106. In some embodiments, the third layer 406 may be spaced away from the second layer 404 by one or more intervening layers of the FSM 106. The separation between the components included in the flexible IC package 100 and the channel 108 may be selected based on the requirements and constraints of a particular application, such as the number of layers in the flexible IC package 100, the amount of heat transfer required, other structural constraints, and the material properties of the FSM 106 and other components of the flexible IC package 100. In accordance with these teachings, any of the embodiments discussed herein with reference to FIGS. 2-17 in which two layers of the FSM 106 are adjacent to each other also teach embodiments in which the two layers are spaced apart by one or more intervening layers, as suitable.

Figure 6:
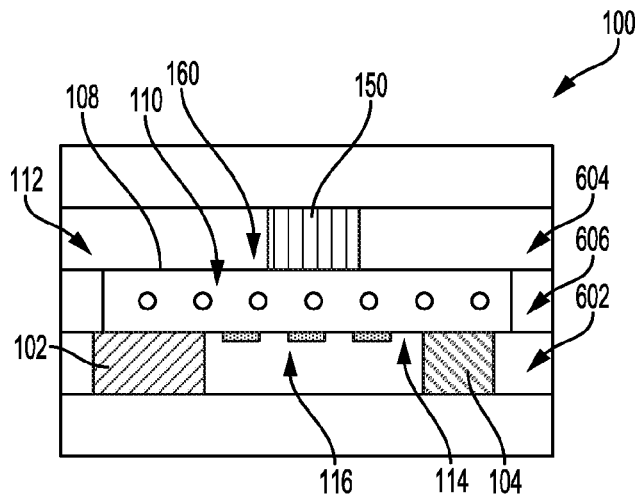
FIG. 6 is a portion of a side view of a third example of a flexible IC package.
Figure 7:
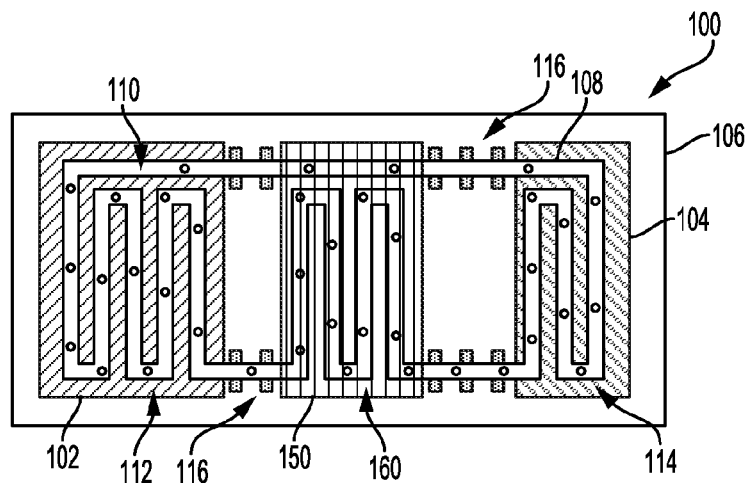
FIG. 7 is a portion of a top view of the third flexible IC package example of FIG. 6, in accordance with various embodiments.

FIGS. 6 and 7 illustrate a third example embodiment of the flexible IC package 100. In particular, FIG. 6 is a portion of a side view of an embodiment of the flexible IC package 100, and FIG. 7 is a portion of a top view of the flexible IC package 100 of FIG. 6. In the embodiment of FIGS. 6 and 7, the flexible IC package 100 includes a first layer 602 of the FSM 106, a second layer 604 of the FSM 106, and a third layer 606 of the FSM 106, with the third layer 606 disposed between the first layer 602 and the second layer 604. The first component 102 and the second component 104 may be disposed in the first layer 602, and a third component 150 may be disposed in the second layer 604. The channel 108 may be disposed in the third layer 606, with the electrolytic fluid 110 disposed therein. The first portion 112 of the channel 108 may be proximate to the first component 102, the second portion 114 of the channel 108 may be proximate to the second component 104, and a third portion 160 of the channel 108 may be proximate to the third component 150. The electrodes 116 may include electrodes disposed between the first layer 602 and the third layer 606 (e.g., printed on the first layer 602 prior to formation of the third layer 606). The electrodes 116 of FIGS. 6 and 7 may be positioned at locations proximate to the channel 108 so as to effect movement of the electrolytic fluid 110 via dynamic electric fields under the control of the electrode controller 192 (not shown).

Figure 8:
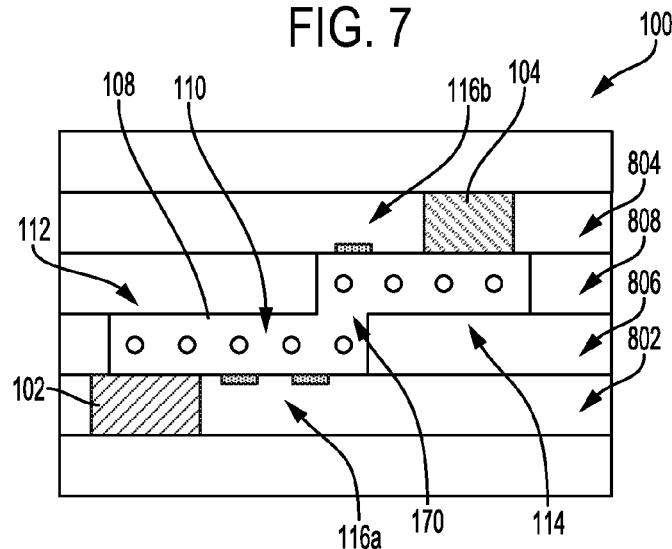
FIG. 8 is a portion of a side view of a fourth example of a flexible IC package.
Figure 9:
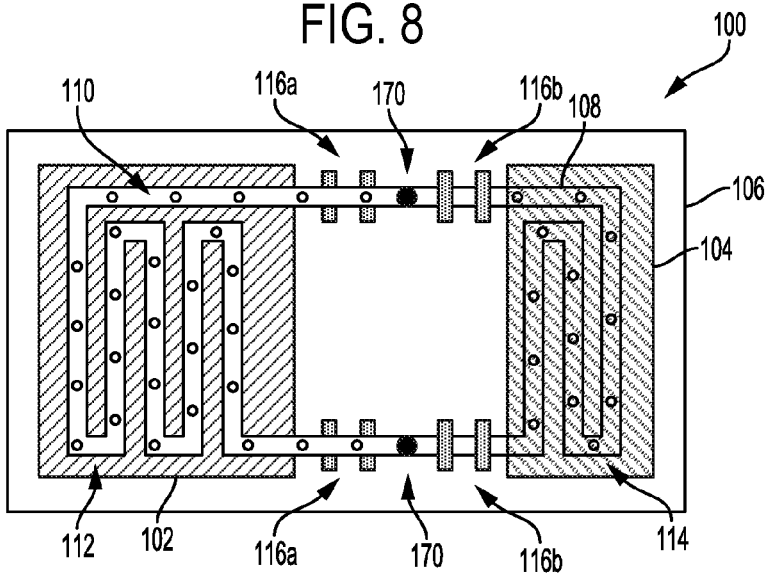
FIG. 9 is a portion of a top view of the fourth flexible IC package example of FIG. 8, in accordance with various embodiments.

FIGS. 8 and 9 illustrate a fourth example embodiment of the flexible IC package 100. In particular, FIG. 8 is a portion of a side view of an embodiment of the flexible IC package 100, and FIG. 9 is a portion of a top view of the flexible IC package 100 of FIG. 8. In the embodiment of FIGS. 8 and 9, the flexible IC package 100 includes a first layer 802 of the FSM 106, a second layer 804 of the FSM 106, a third layer 806 of the FSM 106, and a fourth layer 808 of the FSM 106, with the third layer 806 disposed between the first layer 802 and the fourth layer 808, and the fourth layer 808 disposed between the third layer 806 and the second layer 804. The first component 102 may be disposed in the first layer 802 and the second component 104 may be disposed in the second layer 804. The channel 108 may be arranged to be disposed in the third layer 806 and in the fourth layer 808, with the electrolytic fluid 110 disposed therein. In particular, the channel 108 may include an opening 170 between the third layer 806 and the fourth layer 808, allowing the electrolytic fluid 110 to flow between the third layer 806 and the fourth layer 808. The opening 170 may be formed as a via using standard soft lithography techniques (discussed in further detail below). Thus, the channel 108 of FIGS. 8 and 9 is an example of a multilayer channel. The first portion 112 of the channel 108 may be proximate to the first component 102, and the second portion 114 of the channel 108 may be proximate to the second component 104. The electrodes 116 may include electrodes 116a disposed between the first layer 802 and the third layer 806 (e.g., printed on the first layer 802 prior to formation of the third layer 806), and may include electrodes 116b disposed between the fourth layer 808 and the second layer 804 (e.g., printed on the fourth layer 808 prior to formation of the second layer 804). The electrodes 116 of FIGS. 8 and 9 may be positioned at locations proximate to the channel 108 so as to effect movement of the electrolytic fluid 110 via dynamic electric fields under the control of the electrode controller 192 (not shown).

Figure 10:
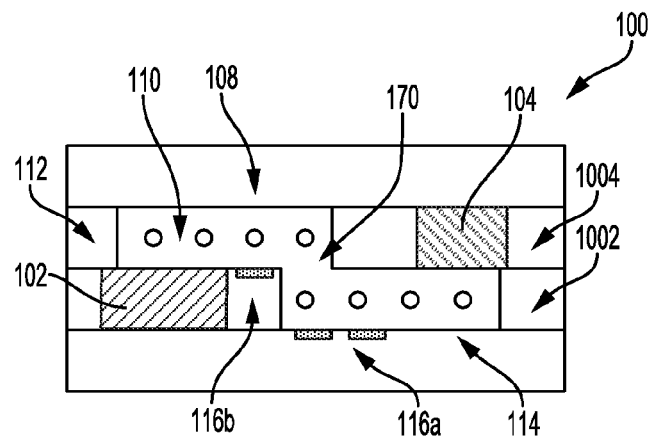
FIG. 10 is a portion of a side view of a fifth example of a flexible IC package.
Figure 11:
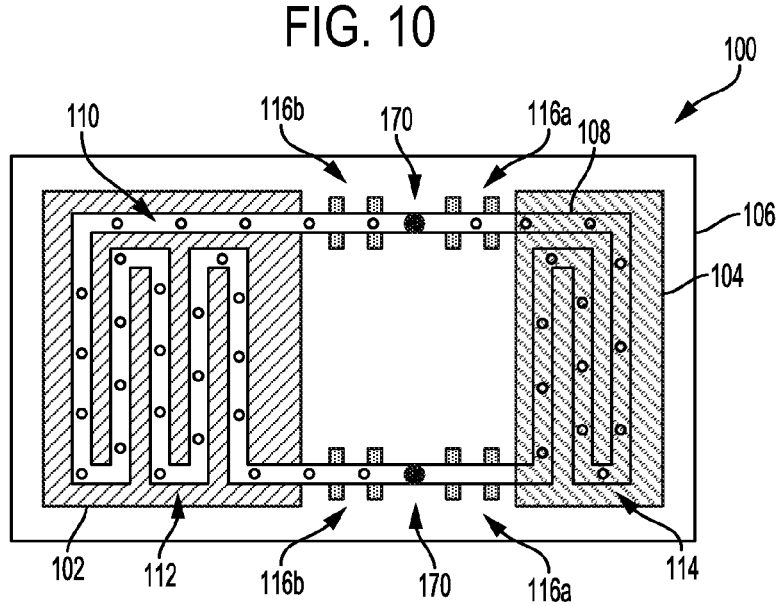
FIG. 11 is a portion of a top view of the fifth flexible IC package example of FIG. 10, in accordance with various embodiments.

FIGS. 10 and 11 illustrate a fifth example embodiment of the flexible IC package 100. In particular, FIG. 10 is a portion of a side view of an embodiment of the flexible IC package 100, and FIG. 11 is a portion of a top view of the flexible IC package 100 of FIG. 10. In the embodiment of FIGS. 10 and 11, the flexible IC package 100 includes a first layer 1002 of the FSM 106 and a second layer 1004 of the FSM 106. The first component 102 may be disposed in the first layer 1002 and the second component 104 may be disposed in the second layer 1004. The channel 108 may be arranged to be disposed in the first layer 1002 and in the second layer 1004, with the electrolytic fluid 110 disposed therein. In particular, the channel 108 may include the opening 170 between the first layer 1002 and the second layer 1004, allowing the electrolytic fluid 110 to flow between the first layer 1002 and the second layer 1004. Thus, the channel 108 of FIGS. 10 and 11 is another example of a multilayer channel. The first portion 112 of the channel 108 may be proximate to the first component 102, and the second portion 114 of the channel 108 may be proximate to the second component 104. The electrodes 116 may include electrodes 116a disposed "under" the first layer 1002 (e.g., printed on an underlying portion of the FSM 106 prior to formation of the first layer 1002) and may include electrodes 116b disposed between the first layer 1002 and the second layer 1004 (e.g., printed on the first layer 1002 prior to formation of the second layer 1004). The electrodes 116 of FIGS. 10 and 11 may be positioned at locations proximate to the channel 108 so as to effect movement of the electrolytic fluid 110 via dynamic electric fields under the control of the electrode controller 192 (not shown).

Figure 12:
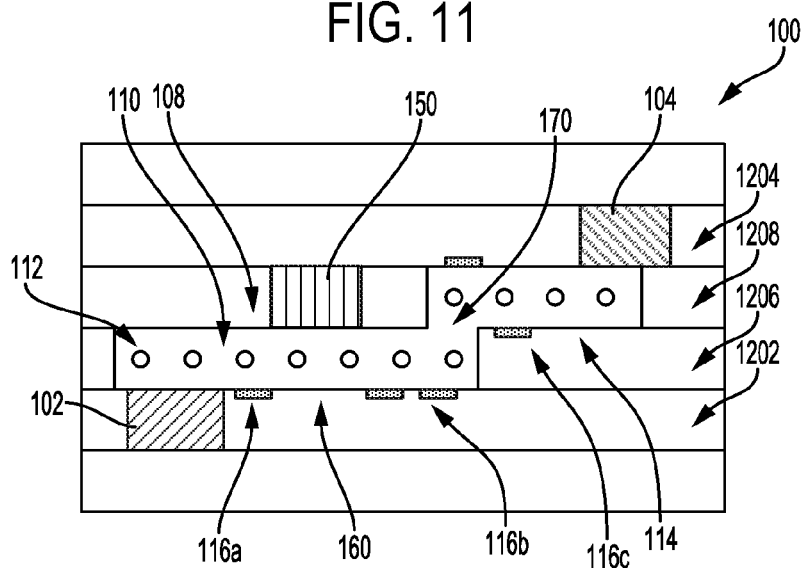
FIG. 12 is a portion of a side view of a sixth example of a flexible IC package.
Figure 13:
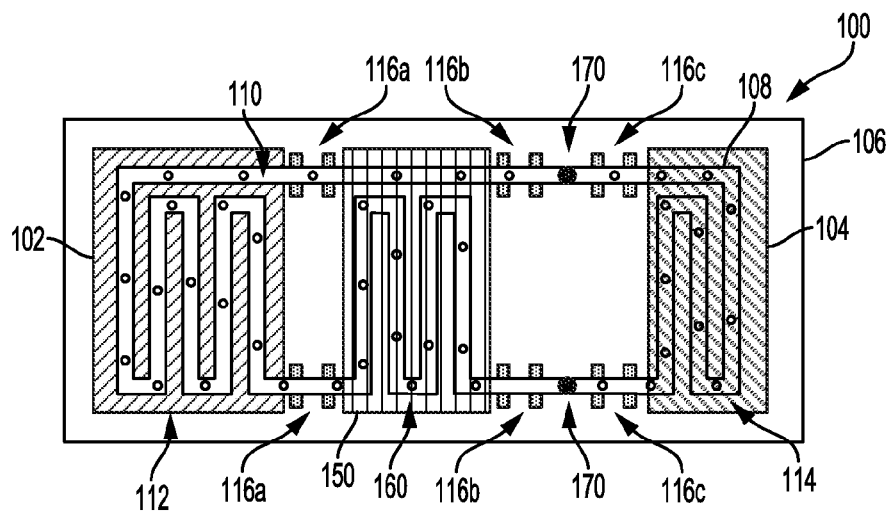
FIG. 13 is a portion of a top view of the sixth flexible IC package example of FIG. 12, in accordance with various embodiments.

FIGS. 12 and 13 illustrate a sixth example embodiment of the flexible IC package 100. In particular, FIG. 12 is a portion of a side view of an embodiment of the flexible IC package 100, and FIG. 13 is a portion of a top view of the flexible IC package 100 of FIG. 12. In the embodiment of FIGS. 12 and 13, the flexible IC package 100 includes a first layer 1202 of the FSM 106, a second layer 1204 of the FSM 106, a third layer 1206 of the FSM 106, and a fourth layer 1208 of the FSM 106, with the third layer 1206 disposed between the first layer 1202 and the fourth layer 1208, and the fourth layer 1208 disposed between the third layer 1206 and the second layer 1204. The first component 102 may be disposed in the first layer 1202, the second component 104 may be disposed in the second layer 1204, and the third component 150 may be disposed in the fourth layer 1208. The channel 108 may be arranged to be disposed in the third layer 1206 and in the fourth layer 1208, with the electrolytic fluid 110 disposed therein. In particular, the channel 108 may include the opening 170 between the third layer 1206 and the fourth layer 1208, allowing the electrolytic fluid 110 to flow between the third layer 1206 and the fourth layer 1208. Thus, the channel 108 of FIGS. 12 and 13 is another example of a multilayer channel. The first portion 112 of the channel 108 may be proximate to the first component 102, the second portion 114 of the channel 108 may be proximate to the second component 104, and the third portion 160 of the channel 108 be proximate to the third component 150. The electrodes 116 may include electrodes 116a and 116b disposed between the first layer 1202 and the third layer 1206 (e.g., printed on the first layer 1202 prior to formation of the third layer 1206) and may include electrodes 116c disposed between the third layer 1206 and the fourth layer 1208 (e.g., printed on the third layer 1206 prior to formation of the fourth layer 1208). The electrodes 116 of FIGS. 12 and 13 may be positioned at locations proximate to the channel 108 so as to effect movement of the electrolytic fluid 110 via dynamic electric fields under the control of the electrode controller 192 (not shown).

Figure 14:
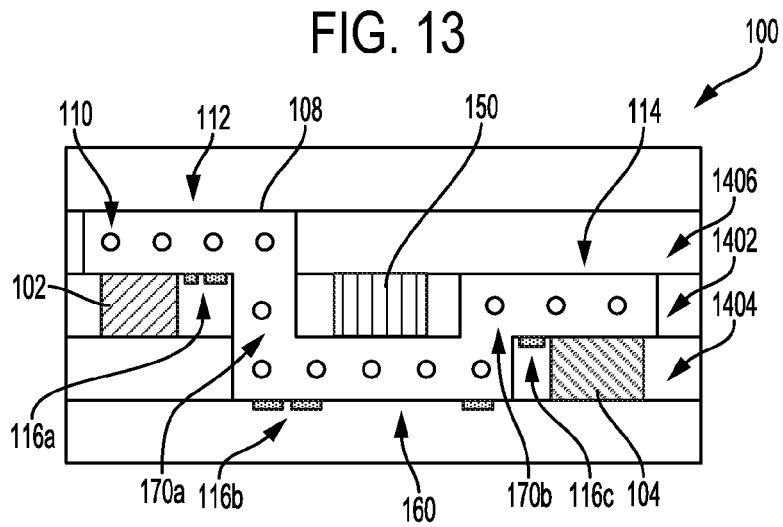
FIG. 14 is a portion of a side view of a seventh example of a flexible IC package.
Figure 15:
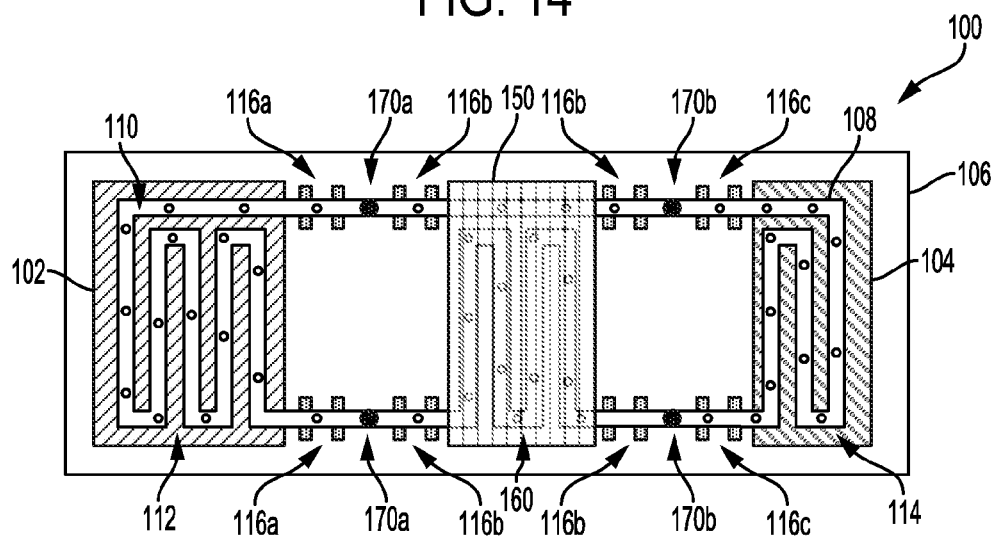
FIG. 15 is a portion of a top view of the seventh flexible IC package example of FIG. 14, in accordance with various embodiments.

FIGS. 14 and 15 illustrate a seventh example embodiment of the flexible IC package 100. In particular, FIG. 14 is a portion of a side view of an embodiment of the flexible IC package 100, and FIG. 15 is a portion of a top view of the flexible IC package 100 of FIG. 14. In the embodiment of FIGS. 14 and 15, the flexible IC package 100 includes a first layer 1402 of the FSM 106, a second layer 1404 of the FSM 106, and a third layer 1406 of the FSM 106, wherein the first layer 1402 is disposed between the second layer 1404 and the third layer 1406. The first component 102 and the third component 150 may be disposed in the first layer 1402, and the second component 104 may be disposed in the second layer 1404. The channel 108 may be arranged to be disposed in the first layer 1402, the second layer 1404, and the third layer 1406, with the electrolytic fluid 110 disposed therein. In particular, the channel 108 may include an opening 170a between the third layer 1406 and the second layer 1404 (spanning the first layer 1402) and an opening 170b between the second layer 1404 and the first layer 1402, allowing the electrolytic fluid 110 to flow between the first layer 1402, second layer 1404, and third layer 1406. Thus, the channel 108 of FIGS. 14 and 15 is another example of a multilayer channel. The first portion 112 of the channel 108 may be proximate to the first component 102, the second portion 114 of the channel 108 may be proximate to the second component 104, and the third portion 160 of the channel 108 may be proximate to the third component 150. The electrodes 116 may include electrodes 116a disposed between the first layer 1402 and the third layer 1406 (e.g., printed on the first layer 1402 prior to formation of the third layer 1406), electrodes 116b disposed "under" the second layer 1404 (e.g., printed on an underlying portion of the FSM 106 prior to formation of the second layer 1404), and electrodes 116c disposed between the second layer 1404 and the first layer 1402 (e.g., printed on the second layer 1404 prior to formation of the first layer 1402). The electrodes 116 of FIGS. 14 and 15 may be positioned at locations proximate to the channel 108 so as to effect movement of the electrolytic fluid 110 via dynamic electric fields under the control of the electrode controller 192 (not shown).

Some embodiments of the flexible IC packages 100 disclosed herein may include multiple channels configured as discussed above with reference to the channel 108. For example, FIGS. 16 and 17 are portions of side views of examples of flexible IC packages 100 with multiple channels, in accordance with various embodiments. In particular, FIG. 16 illustrates the flexible IC package 100 having a first layer 1612 of the FSM 106, a second layer 1614 of the FSM 106, and a third layer 1616 of the FSM 106. A number of components, including a first component 1602, a second component 1604, a third component 1606, a fourth component 1608, and a fifth component 1610, may be included in the flexible IC package 100. Any of the components 1602-1610 may take the form of any of the other components disclosed herein (e.g., the first component 102, the second component 104, and the third component 150). The first component 1602, the second component 1604, the fourth component 1608, and the fifth component 1610 may be disposed in the second layer 1614, and the third component 1606 may be disposed in the first layer 1612. A first channel 1620 may be disposed in the second layer 1614 and the third layer 1616, and may include an opening 1622 between the second layer 1614 and the third layer 1616. An electrolytic fluid 1624 may be disposed in the first channel 1620. Various portions of the first channel 1620 may be proximate to the first component 1602, the second component 1604, and the third component 1606. Electrodes 1630a may be disposed proximate to the first channel 1620. A second channel 1640 may be disposed in the third layer 1616. An electrolytic fluid 1644 may be disposed in the second channel 1640. Various portions of the second channel 1640 may be proximate to the fourth component 1608 and the fifth component 1610. The electrodes 1630b may be disposed proximate to the second channel 1640. The first channel 1620 and the second channel 1640 may be formed in accordance with any of the embodiments of the channel 108 discussed herein, the electrolytic fluid 1624 and the electrolytic fluid 1644 may be formed in accordance with any of the embodiments of the electrolytic fluid 110 discussed herein, and the electrodes 1630a and 1630b may be formed in accordance with any of the embodiments of the electrodes 116 discussed herein.

The channels 1620 and 1640 may include inlets 1626 and 1646, respectively. These inlets may be extensions of the channels 1620 and 1640, respectively, and may extend to an exterior surface of the flexible IC package 100. During manufacture of the flexible IC package 100, the electrolytic fluids 1624 and 1644 may be provided to the channels 1620 and 1640, respectively, via the inlets 1626 and 1646, respectively. After electrolytic fluid has been provided to the channels, seals 1628 and 1648 may be provided to the inlets 1626 and 1646, respectively, to seal the electrolytic fluid 1624 and 1644 within the channels 1620 and 1640, respectively. The seals 1628 and 1648 (and any of the other seals disclosed herein) may be formed from any suitable material, such as the same material as the FSM 106 (e.g., PDMS or PET), thermoplastics, or adhesives among others. Various seals and sealing techniques that may be used in some embodiments of the flexible IC package 100 are discussed in Yuksel et al., Lab-on-a-chip devices: How to close and plug the lab?, *Microelectronic Engineering*, v. 132, pp. 156-175 (2015). Any of the embodiments of the flexible IC package 100 disclosed herein may include inlets and seals as discussed above with reference to FIG. 16, with these elements omitted from most drawings for ease of illustration.

The flexible IC package 100 illustrated in FIG. 16 also includes portions of conductive material 1618 disposed in various layers of the FSM 106. These portions of conductive material 1618 may route electrical signals (e.g., information signals, power, ground, etc.) across layers of the FSM 106 in conjunction with portions of conductive material disposed between layers (not shown) of the FSM 106. In particular, the portions of conductive material 1618 may route signals to and/or from the components 1602-1610. The use of "vertical" and "horizontal" conductive traces within an IC package for signal routing is well known, and thus is not discussed further herein.

FIG. 17 illustrates a flexible IC package 100 having a first layer 1712 of the FSM 106, a second layer 1714 of the FSM 106, a third layer 1716 of the FSM 106, and a fourth layer 1718 of the FSM 106. A number of components, including a first component 1702, a second component 1704, a third component 1706, a fourth component 1708, and a fifth component 1710, may be included in the flexible IC package 100. Any of the components 1702-1710 may take the form of any of the other components disclosed herein (e.g., the first component 102, the second component 104, and the third component 150). The first component 1702, the third component 1706, and the fifth component 1710 may be disposed in the fourth layer 1718. The second component 1704 may be disposed in the first layer 1712, and the fourth component 1708 may be disposed in the second layer 1714. A first channel 1720 may be disposed in the second layer 1714 and the third layer 1716, and may include an opening 1722 between the second layer 1714 and the third layer 1716. An electrolytic fluid 1724 may be disposed in the first channel 1720. Various portions of the first channel 1720 may be proximate to the first component 1702 and the second component 1704. The electrodes 1730a may be disposed proximate to the first channel 1720. A second channel 1740 may be disposed in the third layer 1716. Various portions of the second channel 1740 may be proximate to the third component 1706 and the fourth component 1708. An electrolytic fluid 1744 may be disposed in the second channel 1740. Electrodes 1730b may be disposed proximate to the second channel 1740. In the embodiment illustrated in FIG. 17, no channel may be proximate to the fifth component 1710. The first channel 1720 and the second channel 1740 may be formed in accordance with any of the embodiments of the channel 108 discussed herein, the electrolytic fluid 1724 and the electrolytic fluid 1744 may be formed in accordance with any of the embodiments of the electrolytic fluid 110 discussed herein, and the electrodes 1730a and 1730b may be formed in accordance with any of the embodiments of the electrodes 116 discussed herein.

The flexible IC package 100 illustrated in FIG. 17 also includes portions of conductive material 1750 disposed in various layers of the FSM 106. As discussed above with reference to the embodiment of FIG. 16, these portions of conductive material 1750 may route electrical signals (e.g., information signals, power, ground, etc.) across layers of the FSM 106 in conjunction with portions of conductive material disposed between layers of the FSM 106 (not shown). In particular, the portions of conductive material 1750 may route signals to and/or from the components 1702-1710.

The flexible IC packages 100 disclosed herein may be manufactured using any suitable process. For example, FIGS. 18-20 illustrate various assemblies formed during a process of manufacturing the flexible IC package 100 of FIG. 16, in accordance with various embodiments.

Figure 18:
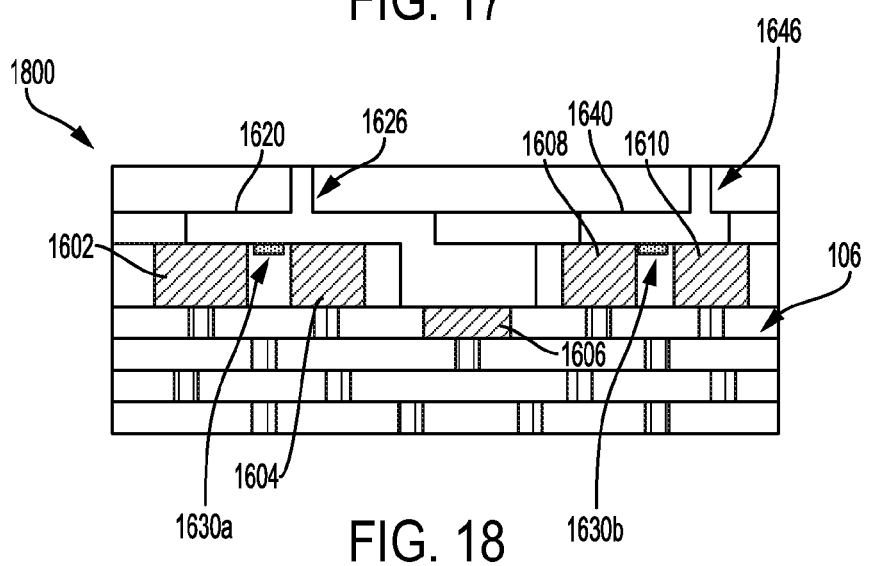
FIGS. 18-20 illustrate various assemblies formed during a process of manufacturing a flexible IC package, in accordance with various embodiments.

FIG. 18 illustrates an assembly 1800 including the FSM 106 having one or more components (e.g., the components 1602-1610) disposed therein, along with a channel (e.g., the first channel 1620 and the second channel 1640). In some embodiments, the channel may form a closed circuit having one or more portions proximate to the one or more components (e.g., as discussed above with reference to FIG. 16). Electrodes (e.g., the electrodes 1630) may be disposed proximate to channels (e.g., the electrodes 1630a may be disposed proximate to the first channel 1620 and the electrodes 1630b may be disposed proximate to the second channel 1640). The channel(s) in the assembly 1800 may include inlet(s) for fluid communication with the exterior (e.g., the inlets 1626 and 1646 of the channels 1620 and 1640, respectively).

Various ones of the embodiments of the flexible IC package 100 disclosed herein, and subassemblies thereof (like assembly 1800) may be manufactured using existing soft lithography techniques, which utilize flexible stamps, molds, and/or flexible photomasks. The use of such techniques may enable the ready adoption and manufacture of the IC packages 100 disclosed herein by mitigating the time and expense involved in retooling. Soft lithography has been used to form channels in flexible materials (e.g., PET and PDMS), and known soft lithography techniques may be used to form any of the channels in FSM disclosed herein (e.g., the channel 108 in the FSM 106). Examples of such techniques are discussed in, e.g., Qin et al., Soft lithography for micro- and nanoscale patterning, *Nature Protocols*, v. 5, n. 3, pp. 491-502 (2010); and Wu et al., Construction of microfluidic chips using polydimethylsiloxane bonding, *Lab Chip*, v. 5, pp. 1393-1398 (2005). Techniques for forming the electrodes 116 in the FSM 106 are also known in the art; examples include the techniques for forming flexible dry copper electrodes discussed in Fernandes et al., Flexible PDMS-based dry electrodes for electro-optic acquisition of ECG signals in wearable devices, *Proceedings of the 32nd Annual International Conference of the IEEE EMBS*, pp. 3503-3506 (2010); and the techniques for forming flexible patterned metal electrodes discussed in Chou et al., Fabrication of stretchable and flexible electrodes based on PDMS substrate, *Proceedings of the 2012 IEEE 25th International Conference on Micro Electro Mechanical Systems*, pp. 247-250 (2012). The assembly 1800 may be formed using any such techniques.

Figure 19:
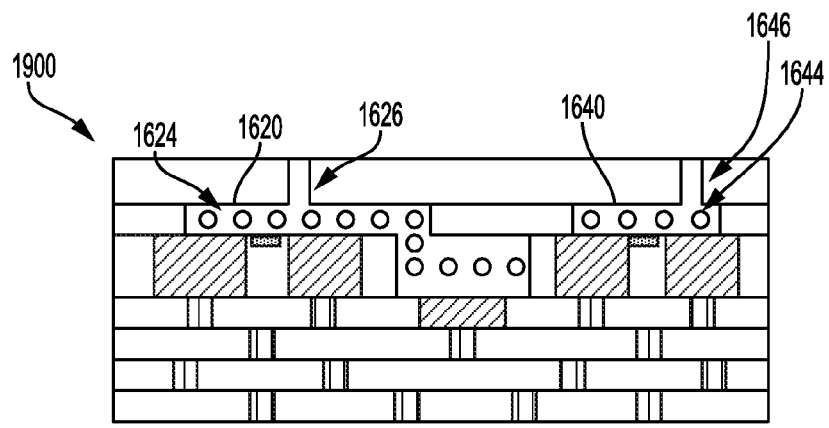
Figure 20:
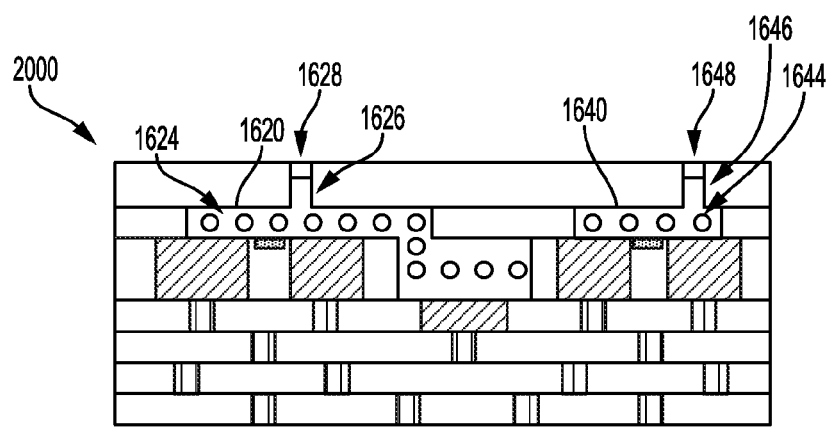

FIG. 19 illustrates an assembly 1900 subsequent to providing electrolytic fluid to the channel(s) in the assembly 1800 (e.g., providing the electrolytic fluid 1624 to the first channel 1620 and providing the electrolytic fluid 1644 to the second channel 1640 via the inlets 1626 and 1646, respectively). Electrolytic fluid may be provided to a channel using a pipette or any other suitable technique.

FIG. 20 illustrates an assembly 2000 subsequent to sealing the inlet(s) of the channel(s) in the assembly 1900 to secure the electrolytic fluid therein (e.g., with the seals 1628 and 1648 in the inlets 1626 and 1646, respectively). The assembly 2000 has the same structure as the flexible IC package 100 of FIG. 16.

Figure 21:
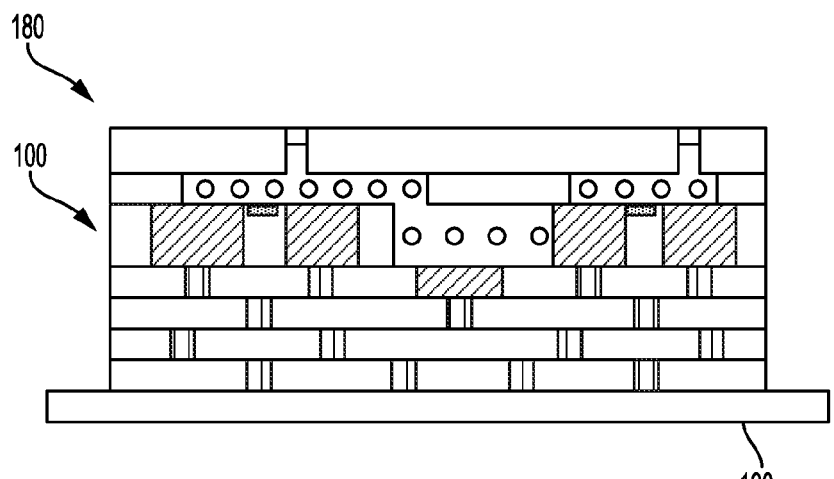
FIG. 21 is a portion of a side view of a flexible IC package coupled to a support structure, in accordance with various embodiments.

As discussed above, the flexible IC packages disclosed herein may be advantageously coupled with a support structure to form a wearable IC device. For example, FIG. 21 is a portion of a side view of a wearable IC device 180 including the flexible IC package 100 of FIG. 16 coupled to a support structure 190, in accordance with various embodiments. Although the support structure 190 is shown as coupled to a single planar face of the flexible IC package 100, this need not be the case, and the support structure 190 may surround the flexible IC package 100, partially surround the flexible IC package 100, contact one or more faces of the flexible IC package 100, or be coupled to the flexible IC package 100 in any suitable manner. In some embodiments, the support structure 190 may be coupled to the flexible IC package 100 using an adhesive (e.g., a permanent or removable adhesive). In some embodiments, the support structure 190 may be coupled to the flexible IC package 100 using a mechanical fastener, such as a hook-and-loop fastener (e.g., with hook material coupled to one of the flexible IC package 100 or the support structure 190, and loop material coupled to the other of the flexible IC package 100 or support structure 190), prongs (e.g., as commonly used to secure precious stones in a ring setting), stitches, or snaps (e.g., with the male portion of a snap coupled to the flexible IC package 100 or the support structure 190, and the female portion of the snap coupled to the other of the flexible IC package 100 or the support structure 190). In some embodiments, the support structure 190 may be coupled to the flexible IC package 100 by embedding the flexible IC package 100 in the material of the support structure 190 (e.g., by capturing the flexible IC package 100 within a pocket, or within layers of cloth via stitching, or by embedding the flexible IC package 100 in a flexible mold compound).

Figure 22:
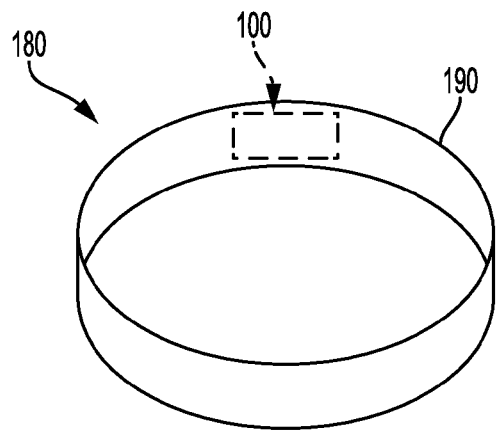
FIG. 22 is a perspective view of a wearable IC device having an armband support structure coupled to a flexible IC package, in accordance with various embodiments.
Figure 23:
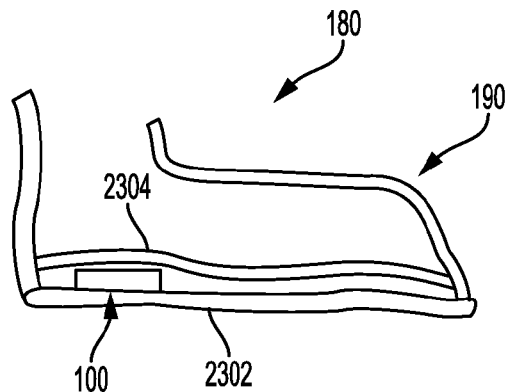
FIG. 23 is a side cross-sectional view of a wearable IC device having a shoe support structure coupled to a flexible IC package, in accordance with various embodiments.

The wearable IC device 180 may be configured for wear on any suitable portion of a user's body. For example, the support structure 190 may be part of a shoe, sock, anklet, orthopedic brace, undergarment, item of clothing, armband, bracelet, ring, glove, necklace, scarf, eyeglasses, ear jewelry, temporary tattoo, sticker, earbud, headset, hat, hair accessory, or any other item worn on the body. For example, FIG. 22 is a perspective view of the wearable IC device 180 having an armband as the support structure 190 coupled to a flexible IC package 100, in accordance with various embodiments. In the embodiment illustrated in FIG. 22, the flexible IC package 100 may be embedded in fabric or other flexible material of the armband support structure 190. The flexible IC package 100 in the embodiment of FIG. 22 may bend and/or stretch with the bending and/or stretching of the armband support structure 190. In another example, FIG. 23 is a side cross-sectional view of the wearable IC device 180 having shoes as the support structure 190 coupled to a flexible IC package 100, in accordance with various embodiments. In the embodiment of FIG. 23, the flexible IC package 100 may be disposed between a sole 2302 of the shoe support structure 190 (formed from, e.g., an elastomeric or other material) and a fabric layer 2304 (which may include, e.g., foam padding or other suitable materials) on which the user's foot rests when the shoe support structure 190 is being worn. The flexible IC package 100 in the embodiment of FIG. 23 may bend and/or stretch with the bending and/or stretching of the shoe support structure 190.

Figure 24:
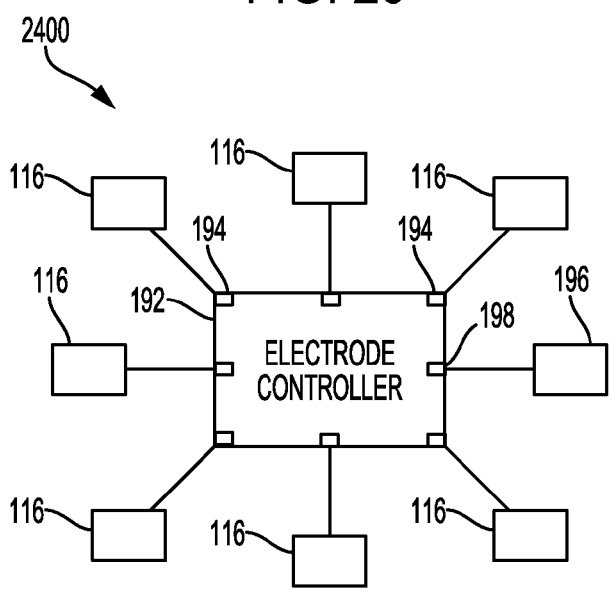
FIG. 24 is a block diagram of an electrode controller arrangement.

As discussed above, the dynamic electric fields generated by the electrodes 116 in the flexible IC packages 100 disclosed herein may be controlled by the electrode controller 192. FIG. 24 is a block diagram of an electrode controller arrangement 2400 including the electrode controller 192 and an exemplary number of electrodes 116. Each electrode 116 may be coupled to an electrode input 194 of the electrode controller 192. The electrode inputs 194 may be conductive contacts on the electrode controller 192, which may itself be a microcontroller or any other suitable processing device. In some embodiments, the electrode controller 192 may be included in a component that is itself thermally managed in accordance with the techniques disclosed herein (e.g., the first component 102). The electrode controller 192 may also include sensor inputs 198 to which one or more sensors 196 may be coupled. For example, as discussed above, the electrode controller 192 may selectively cause various electrodes 116 to generate an electric field in response to the temperatures of one or more components or other components in the flexible IC package 100; the sensors 196 may include one or more temperature sensors, and the electrode controller 192 may receive the temperature data via the sensor inputs 198. Any other sensor may be coupled to the electrode controller 192 as suitable. In some embodiments, the electrode controller 192 may include timer circuitry for use in timing the dynamic electric fields.

As noted above, the channel 108 may have any suitable shape or dimensions. For example, in a number of the embodiments discussed above with reference to FIGS. 2-17, various portions of the channel 108 may have a serpentine structure so as to expose a substantial part of the channel 108 to the components proximate to the channel 108 so that the electrolytic fluid 110 in the channel 108 can absorb heat from the components. FIGS. 25-28 illustrate various example structures that may be used, instead of or in addition to serpentine structures, for the portion(s) of the channel 108 proximate to a component or components in the flexible IC package 100 (e.g., the first portion 112 or the second portion 114), in accordance with various embodiments. For example, FIG. 25 illustrates a linear structure for a portion of the channel 108. FIG. 26 illustrates a boustrophedonic structure for a portion of the channel 108. FIG. 27 illustrates a spiral structure for a portion of the channel 108. FIG. 28 illustrates a zigzag structure for a portion of the channel 108. The structures illustrated in the various drawings are simply illustrative, and any suitable structure may be used.

Other dimensions of the channel 108 may be selected using known techniques that may depend on the electrolytic fluid 110, geometric constraints of the flexible IC package 100, the structure of the channel 108 (e.g., the number of FSM layers traversed by the channel 108 traverses), the dimensions of the components to be cooled, and other factors known to one of skill in the art. In some embodiments, a cross-sectional area of the channel 108 (e.g., the area of a plane through which the electrolytic fluid 110 may flow) may be approximately 1 to 100 microns by 1 to 100 microns. In some embodiments, the components included in the flexible IC package 100 may have dimensions in the millimeters (e.g., a footprint of 2 millimeters by 2 millimeters, and a thickness of 20-100 microns).

Figure 29:
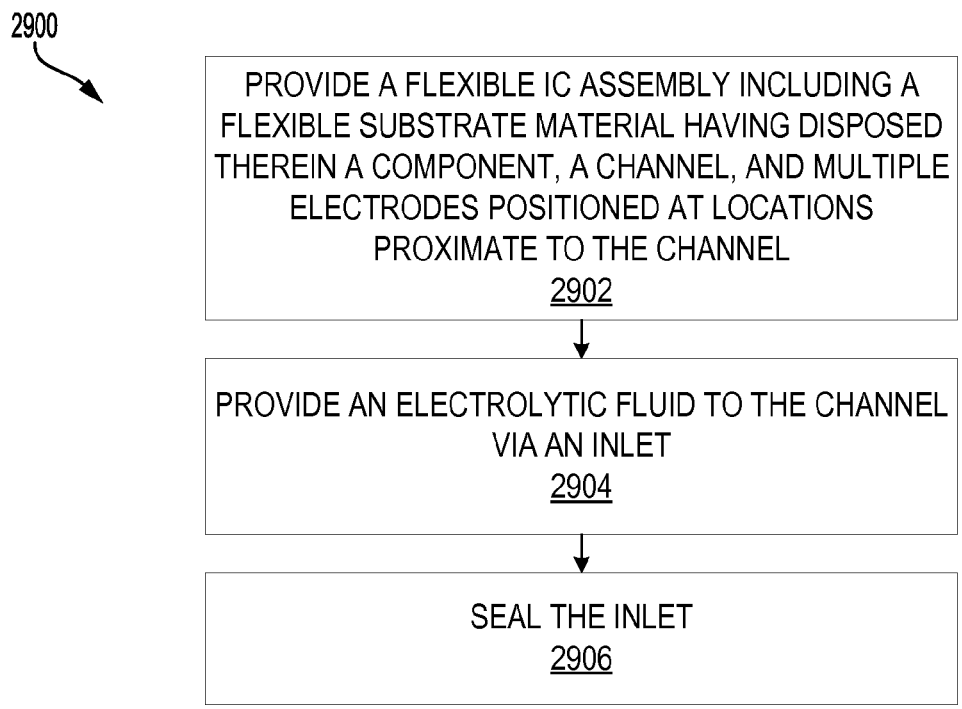
FIG. 29 is a flow diagram of an illustrative process for forming a flexible IC package, in accordance with various embodiments.

FIG. 29 is a flow diagram of an illustrative process 2900 for forming a flexible IC package, in accordance with various embodiments. An embodiment of this process may be used to form the assemblies discussed above with reference to FIGS. 18-20. While the operations of the process 2900 are arranged in a particular order in FIG. 29 and illustrated once each, in various embodiments, one or more of the operations may be repeated, omitted, or performed out of order. Any of the operations of the process 2900 may be performed in accordance with any of the embodiments of the flexible IC packages 100 described herein.

At 2902, a flexible IC assembly may be provided. The flexible IC assembly may include an FSM having disposed therein a component, multiple electrodes, and a channel. In some embodiments, the channel may form a closed circuit having a portion proximate to the component, and the electrodes may be positioned at locations proximate to the channel. In some embodiments, providing the flexible IC assembly may include printing the electrodes on one or more layers of the FSM. In the example of FIG. 1, the flexible IC assembly 100 may include the FSM 106 having disposed therein the first component 102 (and, optionally, the second component 104), multiple electrodes 116, and the channel 108. The first portion 112 of the channel 108 may be proximate to the component 102, and the electrodes 116 may be proximate to the channel 108. An example of a flexible IC assembly that may be provided at 2902 is the assembly 1800 of FIG. 18.

At 2904, the electrolytic fluid may be provided to the channel via the inlet of the flexible IC assembly. For example, the electrolytic fluid 110 may be provided to the channel 108 via the inlet (e.g., as discussed above with reference to FIGS. 16 and 19). An example of a flexible IC assembly having electrolytic fluid in the channel is the assembly 1900 of FIG. 19.

At 2906, after providing the electrolytic fluid, the inlet may be sealed, thus trapping the electrolytic fluid in the chamber. An example of a flexible IC assembly having a sealed inlet is the assembly 2000 of FIG. 20. In some embodiments, after sealing the inlet, the flexible IC assembly (which may be a flexible IC package) may be coupled to a wearable support structure.

Figure 30:
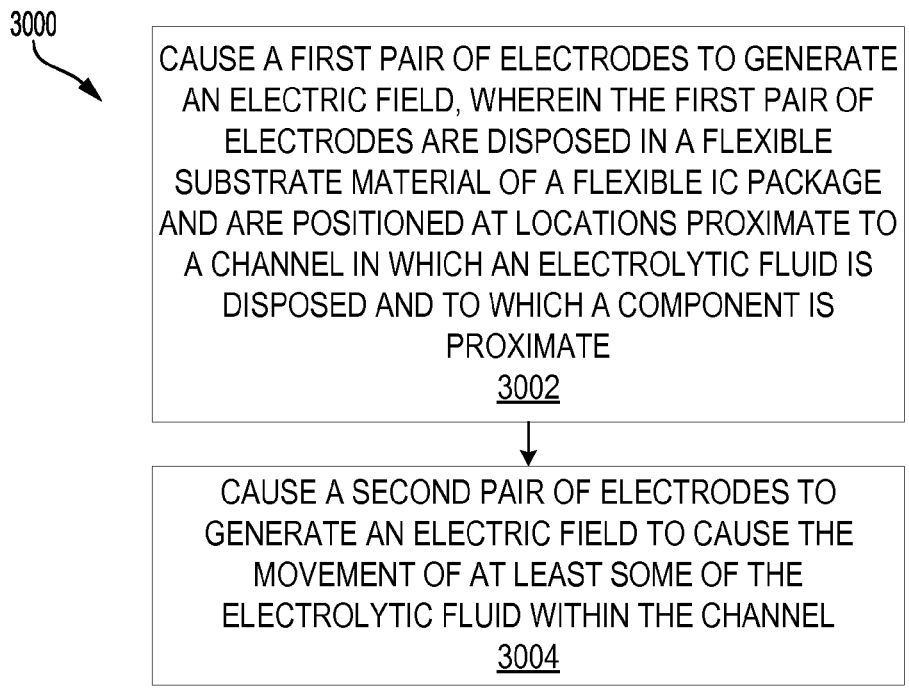
FIG. 30 is a flow diagram of an illustrative process for thermally managing a flexible IC package, in accordance with various embodiments.

FIG. 30 is a flow diagram of an illustrative process 3000 for thermally managing a flexible IC package, in accordance with various embodiments. While the operations of the process 3000 are arranged in a particular order in FIG. 30 and illustrated once each, in various embodiments, one or more of the operations may be repeated, omitted, or performed out of order. Any of the operations of the process 3000 may be performed in accordance with any of the embodiments of the flexible IC packages 100 described herein.

At 3002, an electrode controller may cause a first pair of electrodes, of a set of multiple electrodes, to generate an electric field. The set of multiple electrodes may be disposed in a FSM of a flexible IC package, and may be positioned at locations proximate to a channel in the FSM. An electrolytic fluid may be disposed in the channel. In the example of FIG. 1, the electrode controller 192 may cause a first pair of the electrodes 116 to generate an electric field. The electrodes 116 may be disposed in the FSM 106 and may be positioned at locations proximate to the channel 108. The electrolytic fluid 110 may be disposed in the channel 108. In some embodiments, the first pair of electrodes may be part of a group of three or more electrodes across which various electric fields may be generated at 3002.

At 3004, the electrode controller may cause a second pair of electrodes, of the set of multiple electrodes, to generate an electric field to cause the movement of at least some of the electrolytic fluid within the channel. In some embodiments, the second pair of electrodes may be part of a group of three or more electrodes across which various electric fields may be generated at 3004. In some embodiments, the first pair of electrodes and the second pair of electrodes may share an electrode. For example, the electrode controller 192 may cause a second pair of the electrodes 116 to generate an electric field to cause the movement of at least some of the electrolytic fluid 110 within the channel 108.

The process 3000 may continue as the electrode controller causes various pairs of electrodes to generate electric fields to cause the movement of at least some of the electrolytic fluid within the channel so as to transport heat absorbed by the electrolytic fluid to other portions of the IC package. As discussed above, in some embodiments, the process 3000 may include a determination by the electrode controller that a temperature of a component in the IC package exceeds a threshold, in response to which the first pair of electrodes or the second pair of electrodes may be caused to generate their electric fields. In some embodiments, the temperature threshold associated with a first component is the temperature of a second component; when the temperature of the first component exceeds the temperature of the second component, the electrode controller may cause the generation of electric fields to move the electrolytic fluid. The flexible IC packages disclosed herein may be used to implement any suitable computing device.

Figure 31:
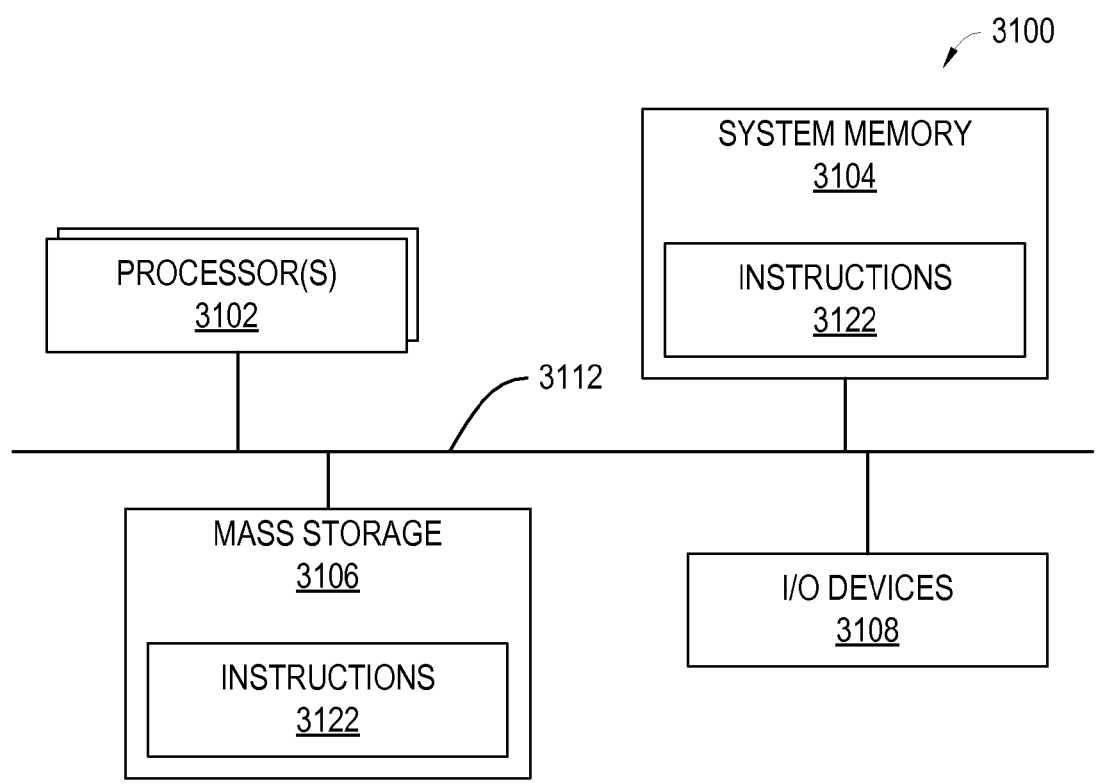
FIG. 31 is a block diagram of an example computing device that may be implemented in or include a flexible IC package as disclosed herein.

FIG. 31 is a block diagram of an example computing device 3100 that may include or be included in the flexible IC package 100 (e.g., as a wearable IC device). As shown, the computing device 3100 may include one or more processors 3102 (e.g., one or more processor cores implemented on one or more components) and a system memory 3104 (implemented on one or more components). As used herein, the term "processor" or "processing device" may refer to any device or portion of a device that processes electronic data from registers and/or memory to transform that electronic data into other electronic data that may be stored in registers and/or memory. The processor(s) 3102 may include one or more microprocessors, graphics processors, digital signal processors, crypto processors, or other suitable devices. More generally, the computing device 3100 may include any suitable computational circuitry, such as one or more Application Specific Integrated Circuits (ASICs).

The computing device 3100 may include one or more mass storage devices 3106 (such as flash memory devices or any other mass storage device suitable for inclusion in a flexible IC package). The system memory 3104 and the mass storage device 3106 may include any suitable storage devices, such as volatile memory (e.g., dynamic random access memory (DRAM)), nonvolatile memory (e.g., read-only memory (ROM)), and flash memory. The computing device 3100 may include one or more I/O devices 3108 (such as display, user input device, network interface cards, modems, and so forth, suitable for inclusion in a flexible IC device). The elements may be coupled to each other via a system bus 3112, which represents one or more buses.

Each of these elements may perform its conventional functions known in the art. In particular, the system memory 3104 and the mass storage device 3106 may be employed to store a working copy and a permanent copy of programming instructions 3122.

The permanent copy of the programming instructions 3122 may be placed into permanent mass storage devices 3106 in the factory or through a communication device included in the I/O devices 3108 (e.g., from a distribution server (not shown)). The constitution of elements 3102-3112 are known, and accordingly will not be further described.

Machine-accessible media (including non-transitory computer-readable storage media), methods, systems, and devices for performing the above-described techniques are illustrative examples of embodiments disclosed herein for thermal management of an IC device. For example, a computer-readable media (e.g., the system memory 3104 and/or the mass storage device 3106) may have stored thereon instructions (e.g., the instructions 3122) such that, when the instructions are executed by one or more of the processors 3102, the instructions cause the computing device 3100 to perform the thermal management method of FIG. 30.

As noted above, although the thermal management systems and techniques disclosed herein may be particularly advantageous when used to thermally manage flexible IC packages, these systems and techniques may also be implemented to improve thermal management of conventional, rigid IC packages. Thus, any of the embodiments disclosed herein and described as applicable in a flexible IC package may also apply in a conventional, rigid IC package setting. Such a rigid IC package may include, for example, a rigid substrate material and/or a rigid overmold material.

Additionally, although the thermal management systems and techniques disclosed herein may be particularly advantageous when used to thermally manage components (or "component sections," as discussed above), these systems and techniques may be used to thermally manage any devices included in an IC package, such as a resistor, capacitor, transistor, inductor, radio, memory, processor, laser, light-emitting diode (LED), sensor, a memory gate, combinational or state logic, or other digital or analog component. A device thermally managed by the thermal management systems and techniques disclosed herein may be a packaged component (e.g., a surface mount, flip chip, ball grid array, land grid array, bumpless buildup layer, or other package) or an unpackaged component.

The following paragraphs provide examples of various ones of the embodiments disclosed herein.

Example 1 is a flexible integrated circuit (IC) package, including: flexible substrate material; a component disposed in the flexible substrate material; a channel disposed in the flexible substrate material forming a closed circuit, wherein a portion of the channel is proximate to the component; a plurality of electrodes disposed in the flexible substrate material and positioned at locations proximate to the channel, wherein the plurality of electrodes are coupled to an electrode controller to selectively cause two or more of the plurality of electrodes to generate an electric field; and an electrolytic fluid disposed in the channel.

Example 2 may include the subject matter of Example 1, wherein the flexible substrate material includes polyethylene terephthalate or polydimethylsiloxane.

Example 3 may include the subject matter of Example 1, and may further specify that: the component is a first component; the portion of the channel is a first portion of the channel; the flexible IC package further comprises a second component disposed in the flexible substrate material; and a second portion of the channel is proximate to the second component.

Example 4 may include the subject matter of Example 3, and may further specify that the first component is disposed in a first layer of the flexible substrate material, the second component is disposed in a second layer of the flexible substrate material, the first layer is different from the second layer, and adjacent layers of the flexible substrate material are separated by printed circuitry.

Example 5 may include the subject matter of Example 4, and may further specify that the first layer and the second layer are spaced apart by one or more layers of the flexible substrate material.

Example 6 may include the subject matter of Example 4, and may further specify that the plurality of electrodes are disposed between the first layer and the second layer.

Example 7 may include the subject matter of Example 1, and may further specify that the component is disposed in a first layer of the flexible substrate material, the portion of the channel is disposed in a second layer of the flexible substrate material, and the first and second layers are adjacent layers of the flexible substrate material.

Example 8 may include the subject matter of Example 7, and may further specify that: the component is a first component; the portion of the channel is a first portion of the channel; the flexible IC package further comprises a second component disposed in the flexible substrate material; a second portion of the channel is proximate to the second component; and the second component is disposed in a third layer of the flexible substrate material, the second portion of the channel is disposed in a fourth layer of the flexible substrate material, and the third and fourth layers are adjacent layers of the flexible substrate material.

Example 9 may include the subject matter of Example 8, and may further specify that the second layer and the fourth layer are different layers of the flexible substrate material.

Example 10 may include the subject matter of Example 8, and may further specify that the second layer and the fourth layer are a same layer of the flexible substrate material.

Example 11 may include the subject matter of Example 1, and may further specify that the plurality of electrodes are disposed between layers of the flexible substrate material.

Example 12 may include the subject matter of Example 1, and may further specify that the channel includes a via extending between different layers of the flexible substrate material.

Example 13 may include the subject matter of Example 12, and may further specify that the via extends between a first layer of the flexible substrate material and a second layer of the flexible substrate material, and the first layer and second layer are spaced apart by one or more layers of the flexible substrate material.

Example 14 may include the subject matter of Example 1, and may further specify that: the component is a first component; the portion of the channel is a first portion of the channel; the flexible IC package further comprises a second component and a third component disposed in the flexible substrate material; a second portion of the channel is proximate to the second component and a third portion of the channel is proximate to the third component; and the first component is disposed in a first layer of the flexible substrate material, the second component is disposed in a second layer of the flexible substrate material, the third component is disposed in a third layer of the flexible substrate material, and the third layer is disposed between the first layer and the second layer.

Example 15 may include the subject matter of Example 14, and may further specify that the first portion of the channel is disposed between the first layer and the third layer, and the second portion of the channel is disposed between the third layer and the second layer.

Example 16 may include the subject matter of Example 1, and may further specify that: the component is a first component; the portion of the channel is a first portion of the channel; the flexible IC package further comprises a second component and a third component disposed in the flexible substrate material; a second portion of the channel is proximate to the second component and a third portion of the channel is proximate to the third component; and the first and second components are disposed in a first layer of the flexible substrate material, the third component is disposed in a second layer of the flexible substrate material, and the first and second layers are different layers of the flexible substrate material.

Example 17 may include the subject matter of Example 1, and may further specify that the component is a first component, the channel is a first channel, the plurality of electrodes is a first plurality of electrodes, the electrolytic fluid is a first electrolytic fluid, and the flexible IC package further includes: a second component disposed in the flexible substrate material; a second channel disposed in the flexible substrate material forming a closed circuit, and may further specify that a portion of the second channel is proximate to the second component; a second plurality of electrodes disposed in the flexible substrate material and positioned at locations proximate to the second channel; and a second electrolytic fluid disposed in the second channel.

Example 18 may include the subject matter of Example 1, and may further specify that the plurality of electrodes includes a first set of electrodes and a second set of electrodes, the component is disposed in a first layer of the flexible substrate material, and the first layer of the flexible substrate material is disposed between the first set of electrodes and the second set of electrodes.

Example 19 may include the subject matter of any of Examples 1-18, and may further specify that the portion of the channel has a serpentine structure.

Example 20 may include the subject matter of any of Examples 1-18, and may further specify that the electrolytic fluid includes electrolyte droplets in oil.

Example 21 may include the subject matter of any of Examples 1-18, and may further include the electrode controller.

Example 22 may include the subject matter of any of Examples 1-18, and may further specify that the electrode controller is to selectively cause two or more of the plurality of electrodes to generate the electric field based on one or more indicators of a temperature of the component.

Example 23 may include the subject matter of any of Examples 1-18, and may further specify that the electrode controller is to selectively cause two or more of the plurality of electrodes to generate the electric field to circulate the electrolytic fluid in the channel.

Example 24 may include the subject matter of any of Examples 1-18, and may further specify that the component is a die or a sensor.

Example 25 is a wearable integrated circuit (IC) device, including: a flexible integrated circuit (IC) package, including flexible substrate material, a component disposed in the flexible substrate material, a channel disposed in the flexible substrate material forming a closed circuit, wherein a portion of the channel is proximate to the component, a plurality of electrodes disposed in the flexible substrate material and positioned at locations proximate to the channel, wherein the plurality of electrodes are coupled to an electrode controller to selectively cause two or more of the plurality of electrodes to generate an electric field, and an electrolytic fluid disposed in the channel; and a wearable support structure coupled to the flexible IC package.

Example 26 may include the subject matter of Example 25, and may further specify that the wearable support structure comprises an adhesive backing.

Example 27 may include the subject matter of Example 25, and may further specify that the wearable support structure comprises a fabric.

Example 28 may include the subject matter of any of Examples 25-27, and may further specify that the component includes a processing device or a memory device.

Example 29 is a method of forming a flexible integrated circuit (IC) package, including: providing a flexible IC assembly including a flexible substrate material having disposed therein a component, a plurality of electrodes, and a channel, wherein the channel forms a closed circuit having a portion proximate to the component, and wherein the plurality of electrodes are positioned at locations proximate to the channel; providing an electrolytic fluid to the channel via an inlet of the flexible IC assembly; and after providing the electrolytic fluid, sealing the inlet.

Example 30 may include the subject matter of Example 29, and may further include, after sealing the inlet, coupling the flexible IC assembly to a wearable support structure.

Example 31 may include the subject matter of any of Examples 29-30, and may further specify that providing the flexible IC assembly includes printing one or more electrodes of the plurality of electrodes on one or more layers of the flexible substrate material.

Example 32 is a method of thermally managing a flexible integrated circuit (IC) package, including: causing, by an electrode controller, a first pair of electrodes to generate an electric field, wherein the first pair of electrodes is disposed in a flexible substrate material of the flexible IC package and positioned at locations proximate to a channel in the flexible substrate material, and wherein an electrolytic fluid is disposed in the channel; causing, by the electrode controller, a second pair of electrodes to generate the electric field to cause the movement of at least some of the electrolytic fluid within the channel, wherein the second pair of electrodes is disposed in the flexible substrate material of the flexible IC package and positioned at locations proximate to the channel in the flexible substrate material; wherein the channel forms a closed circuit, a component is disposed in the flexible substrate material, and the channel includes a portion proximate to the component.

Example 33 may include the subject matter of Example 32, and may further include, before causing the first pair of electrodes to generate the electric field or causing the second pair of electrodes to generate the electric field, determining, by the electrode controller, that a temperature of the component exceeds a threshold; wherein causing the first pair of electrodes to generate the electric field and causing the second pair of electrodes to generate the electric field are performed in response to the determination.

Example 34 may include the subject matter of Example 33, and may further specify that: the component is a first component; the portion of the channel is a first portion of the channel; a second component is disposed in the flexible substrate material; the channel includes a second portion proximate to the second component; and determining that a temperature of the first component exceeds a threshold comprises determining that the temperature of the first component exceeds a temperature of the second component.

Example 35 may include the subject matter of any of Examples 33-34, and may further specify that the first pair of electrodes and the second pair of electrodes share an electrode.

What is claimed is:

1. A wearable integrated circuit (IC) device, comprising:
    a flexible integrated circuit (IC) package, including:
        flexible substrate material,
        a component in the flexible substrate material, wherein the component comprises a processing device or a memory device,
        a channel in the flexible substrate material forming a closed circuit, wherein a portion of the channel is proximate to the component,
        a plurality of electrodes in the flexible substrate material and positioned at locations proximate to the channel, wherein the plurality of electrodes are coupled to an electrode controller to selectively cause two or more of the plurality of electrodes to generate an electric field, and
        an electrolytic fluid in the channel,
        wherein the channel includes a section with multiple non-branching bends to provide multiple adjacent parallel segments of the channel; and
    a wearable support structure coupled to the flexible IC package.

2. The wearable IC device of claim 1, wherein the wearable support structure comprises an adhesive backing or a fabric.

3. The wearable IC device of claim 1, wherein the flexible substrate material includes polyethylene terephthalate or polydimethylsiloxane.

4. The wearable IC device of claim 1, wherein:
    the component is a first component;
    the portion of the channel is a first portion of the channel;
    the flexible IC package further comprises a second component in the flexible substrate material; and
    a second portion of the channel is proximate to the second component.

5. The wearable IC device of claim 4, wherein the first component is in a first layer of the flexible substrate material, the second component is in a second layer of the flexible substrate material, the first layer is different from the second layer, and adjacent layers of the flexible substrate material are separated by printed circuitry.

6. The wearable IC device of claim 1, wherein the component is in a first layer of the flexible substrate material, the portion of the channel is in a second layer of the flexible substrate material, and the first and second layers are adjacent layers of the flexible substrate material.

7. The wearable IC device of claim 6, wherein:
    the component is a first component;
    the portion of the channel is a first portion of the channel;
    the flexible IC package further comprises a second component in the flexible substrate material;
    a second portion of the channel is proximate to the second component; and
    the second component is in a third layer of the flexible substrate material, the second portion of the channel is in a fourth layer of the flexible substrate material, and the third and fourth layers are adjacent layers of the flexible substrate material.

8. The wearable IC device of claim 7, wherein the second layer and the fourth layer are a same layer of the flexible substrate material.

9. The wearable IC device of claim 1, wherein the channel includes a via extending between different layers of the flexible substrate material.

10. The wearable IC device of claim 9, wherein the via extends between a first layer of the flexible substrate material and a second layer of the flexible substrate material, and the first layer and second layer are spaced apart by one or more layers of the flexible substrate material.

11. The wearable IC device of claim 1, wherein:
    the component is a first component;
    the portion of the channel is a first portion of the channel;
    the flexible IC package further comprises a second component and a third component in the flexible substrate material;
    a second portion of the channel is proximate to the second component and a third portion of the channel is proximate to the third component; and
    the first component is in a first layer of the flexible substrate material, the second component is in a second layer of the flexible substrate material, the third component is in a third layer of the flexible substrate material, and the third layer is between the first layer and the second layer.

12. The wearable IC device of claim 1, wherein the section of the channel has a serpentine structure or a boustrophedonic structure.

13. The wearable IC device of claim 1, wherein the electrolytic fluid includes electrolyte droplets in oil.

14. The wearable IC device of claim 1, wherein the electrode controller is to selectively cause two or more of the plurality of electrodes to generate the electric field to circulate the electrolytic fluid in the channel.

15. The wearable IC device of claim 1, wherein the electrode controller is to:
    before selectively causing two or more of the plurality of electrodes to generate an electric field, determine that a temperature of the component exceeds a threshold;
    wherein selectively causing the two or more of the plurality of electrodes to generate an electric field is performed in response to the determination.

16. The wearable IC device of claim 15, wherein the component is a first component, a second component is in the flexible substrate material, and determine that a temperature of the component exceeds a threshold comprises determine that the temperature of the first component exceeds a temperature of the second component.

* * * * *